United States Patent
Noguchi et al.

(10) Patent No.: US 8,049,259 B2
(45) Date of Patent: *Nov. 1, 2011

(54) SEMICONDUCTOR DEVICE INCLUDING MEMORY CELL HAVING CHARGE ACCUMULATION LAYER

(75) Inventors: Mitsuhiro Noguchi, Yokohama (JP); Kenji Gomikawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/966,115

(22) Filed: Dec. 13, 2010

(65) Prior Publication Data

US 2011/0079835 A1    Apr. 7, 2011

Related U.S. Application Data

(63) Continuation of application No. 12/326,482, filed on Dec. 2, 2008, now Pat. No. 7,872,289.

(30) Foreign Application Priority Data

Dec. 7, 2007 (JP) ................................ 2007-317582

(51) Int. Cl.
*H01L 29/76* (2006.01)
*H01L 27/108* (2006.01)
*H01L 29/94* (2006.01)
*H01L 31/119* (2006.01)
*H01L 31/113* (2006.01)

(52) U.S. Cl. ......... 257/296; 257/309; 257/295; 257/306

(58) Field of Classification Search .................. 257/295, 257/296, 298, 254, 300, 324, 532, 306, 303, 257/311, 344

See application file for complete search history.

(56) References Cited

U.S. PATENT DOCUMENTS

| 5,708,284 | A | 1/1998 | Onishi |
| 5,990,507 | A | 11/1999 | Mochizuki et al. |
| 6,291,847 | B1 | 9/2001 | Ohyu et al. |
| 6,455,370 | B1 * | 9/2002 | Lane ............................. 438/253 |
| 7,245,534 | B2 | 7/2007 | Goda et al. |
| 7,872,289 | B2 * | 1/2011 | Noguchi et al. .............. 257/296 |
| 2009/0174031 | A1 | 7/2009 | Wang et al. |
| 2010/0258850 | A1 | 10/2010 | Aoi |

FOREIGN PATENT DOCUMENTS

| JP | 10-75568 | 3/1998 |
| JP | 10-304653 | 11/1998 |
| JP | 2000-299440 | 10/2000 |
| JP | 2001-231248 | 8/2001 |
| JP | 2003-33008 | 1/2003 |
| JP | 2003-51550 | 2/2003 |
| JP | 2003-102166 | 4/2003 |

* cited by examiner

*Primary Examiner* — Chuong A. Luu

(74) *Attorney, Agent, or Firm* — Oblon, Spivak, McClelland, Maier & Neustadt, L.L.P.

(57) ABSTRACT

A semiconductor device includes MOS transistors, capacitor elements, a voltage generating circuit, a contact plug, and a memory cell. The MOS transistor and the capacitor element are formed on a first one of the element regions and a second one of the element regions, respectively. In the voltage generating circuit, current paths of the MOS transistors are series-connected and the capacitor elements are connected to the source or drain of the MOS transistors. The contact plug is formed on the source or the drain to connect the MOS transistors or one of the MOS transistors and one of the capacitor elements. A distance between the gate and the contact plug both for a first one of the MOS transistors located in the final stage in the series connection is larger than that for a second one of the MOS transistors located in the initial stage in the series connection.

26 Claims, 26 Drawing Sheets

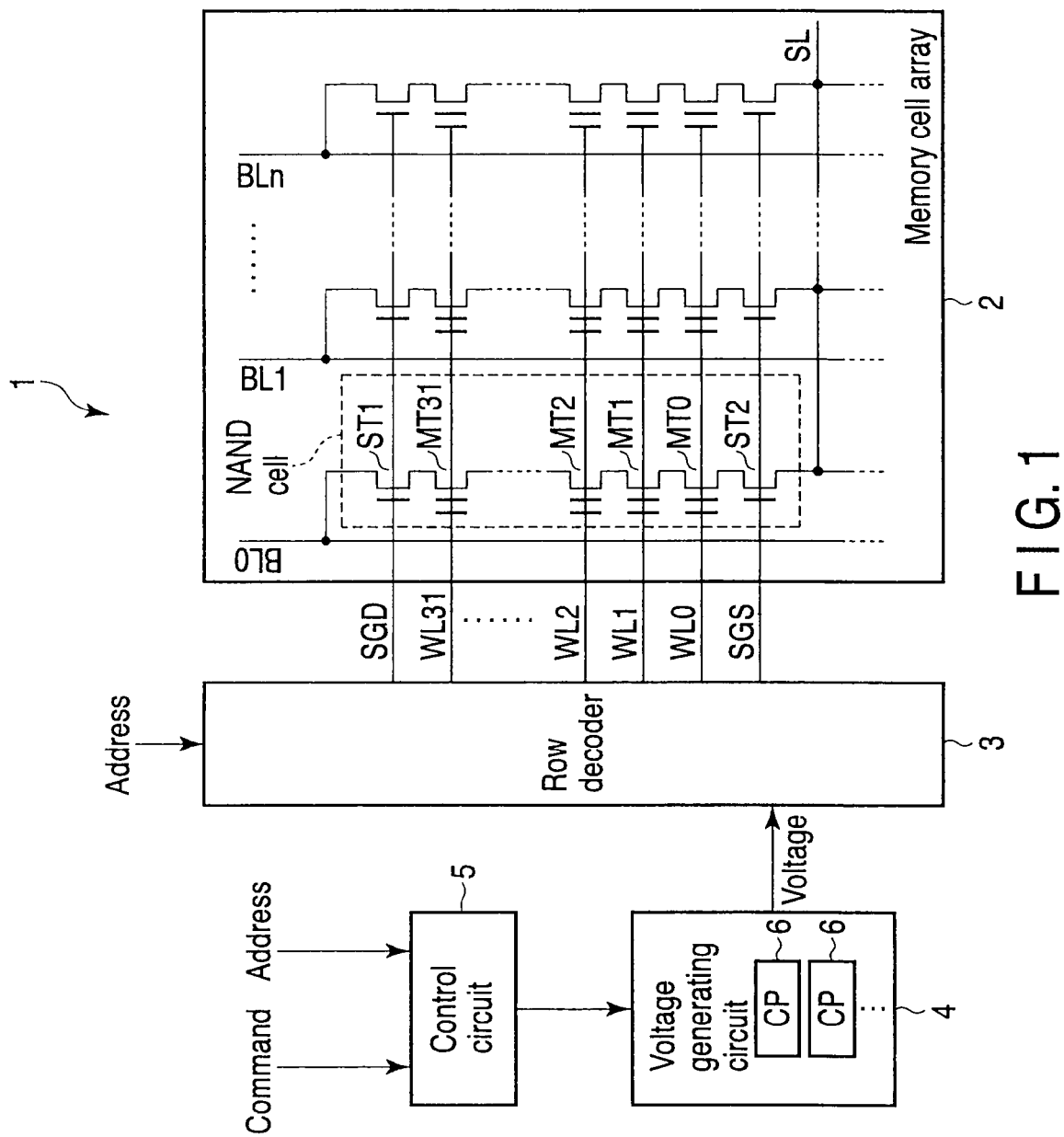
F I G. 1

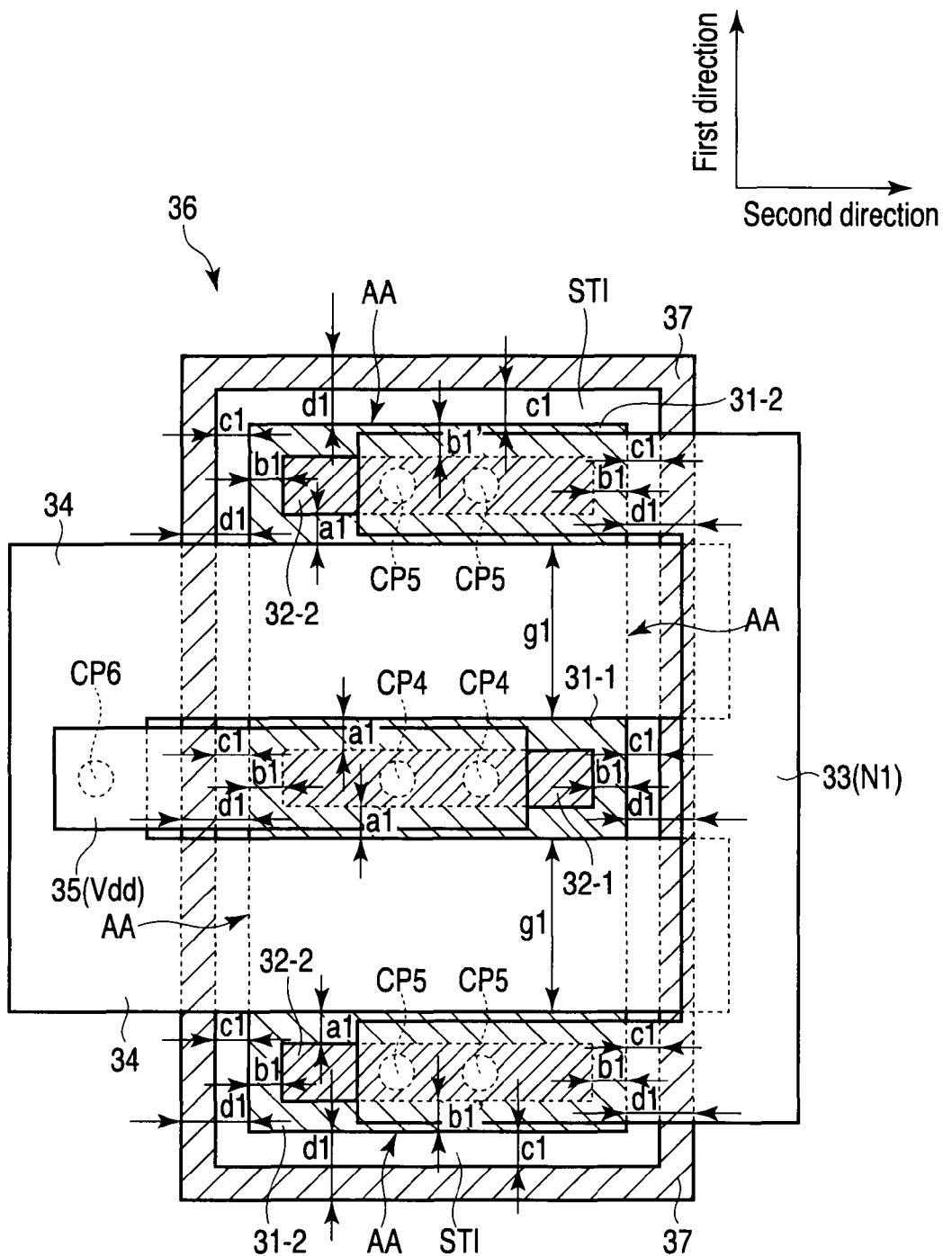
F I G. 4

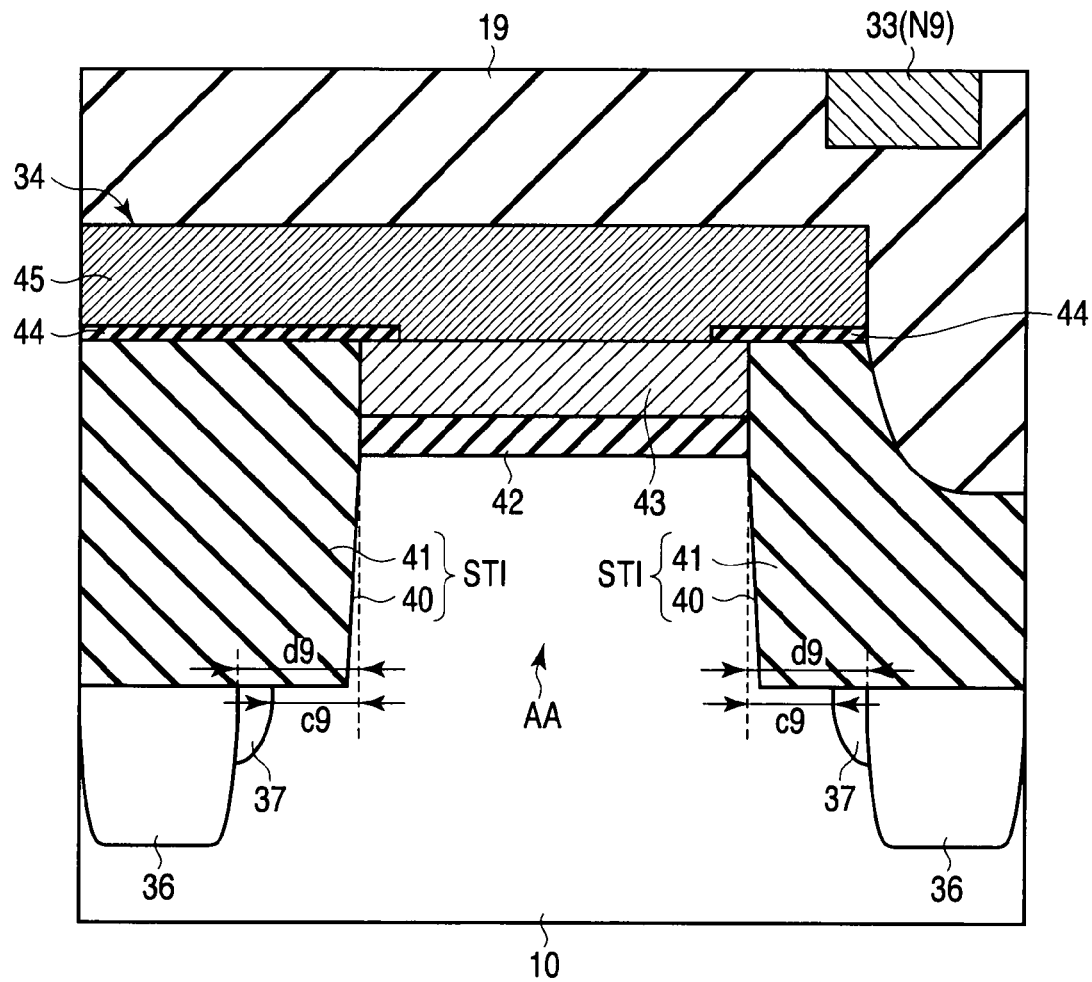
F I G. 9

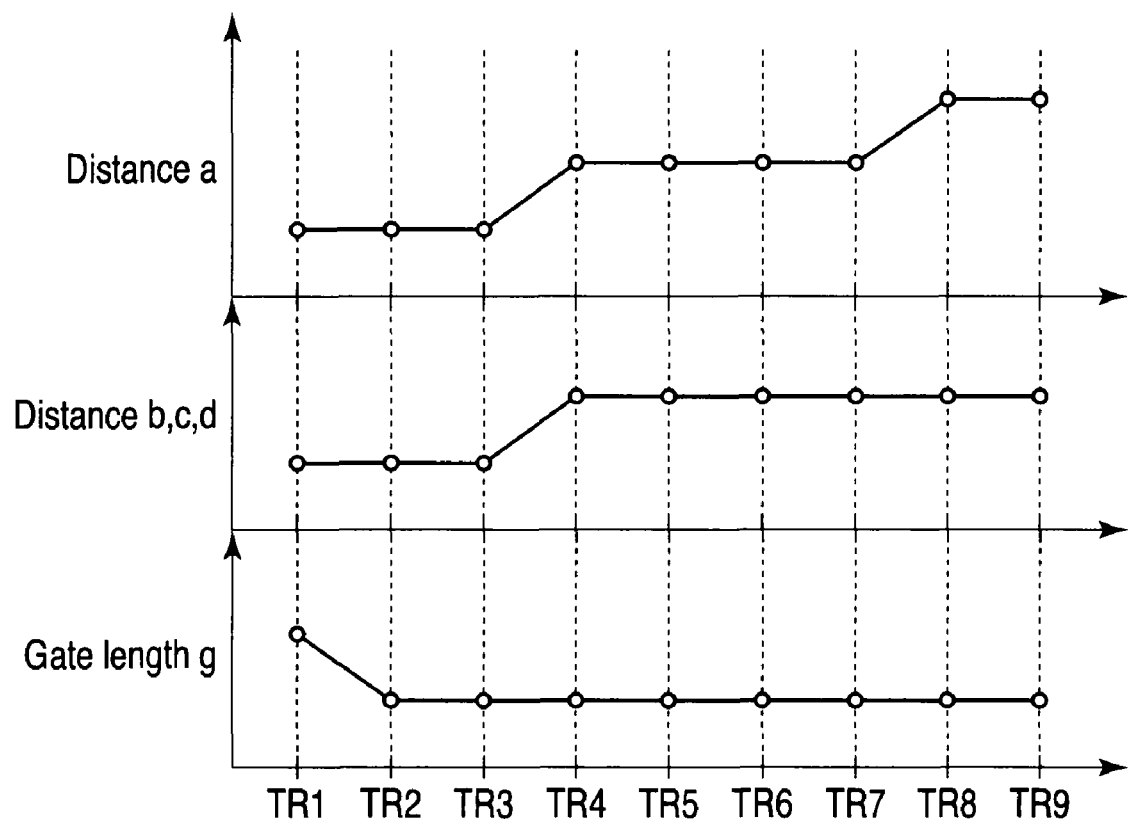
F I G. 1 1

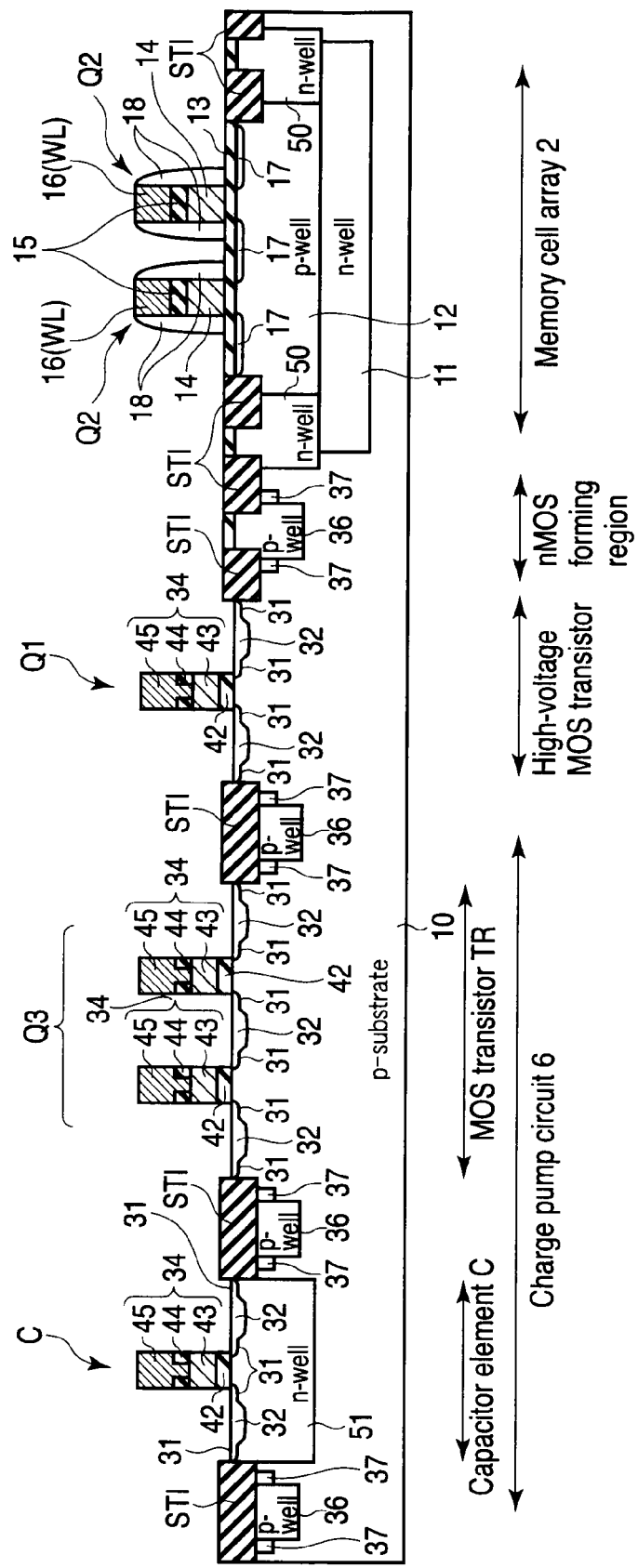
F I G. 14

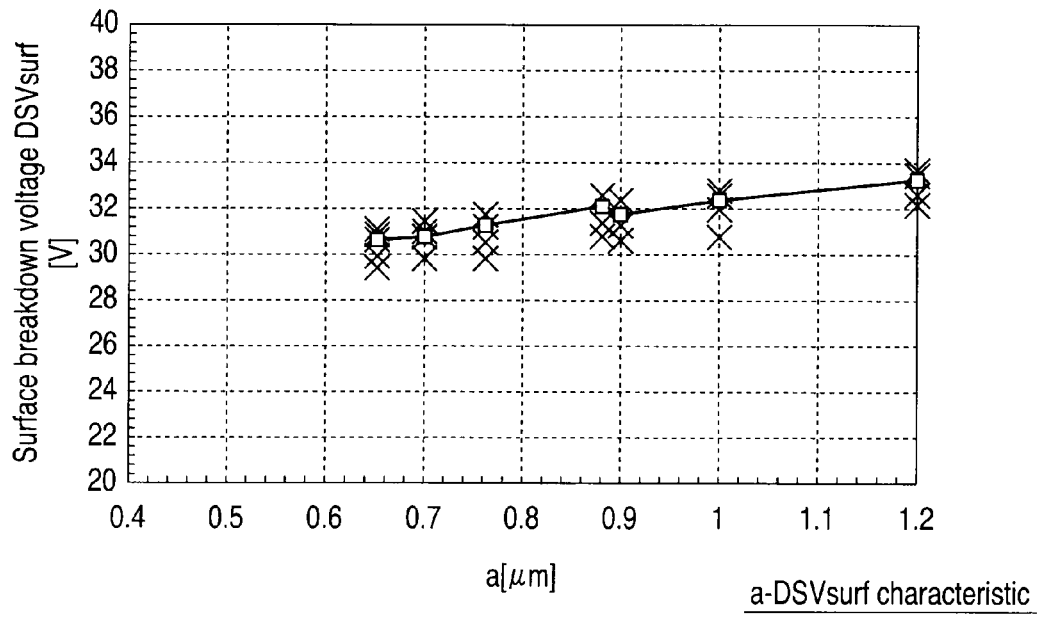
F I G. 20
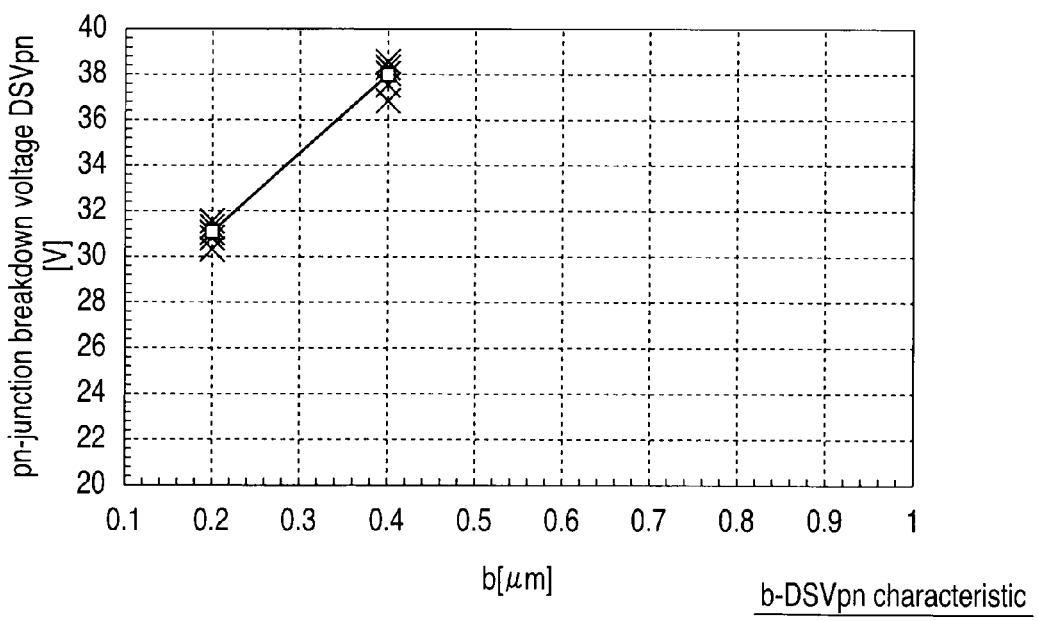
F I G. 21

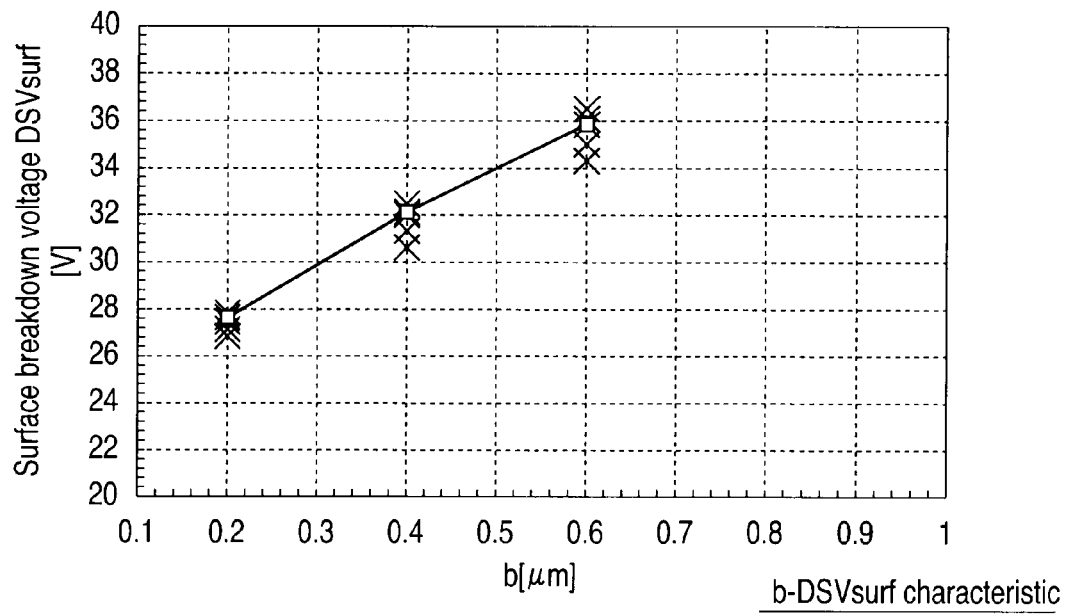
F I G. 2 2
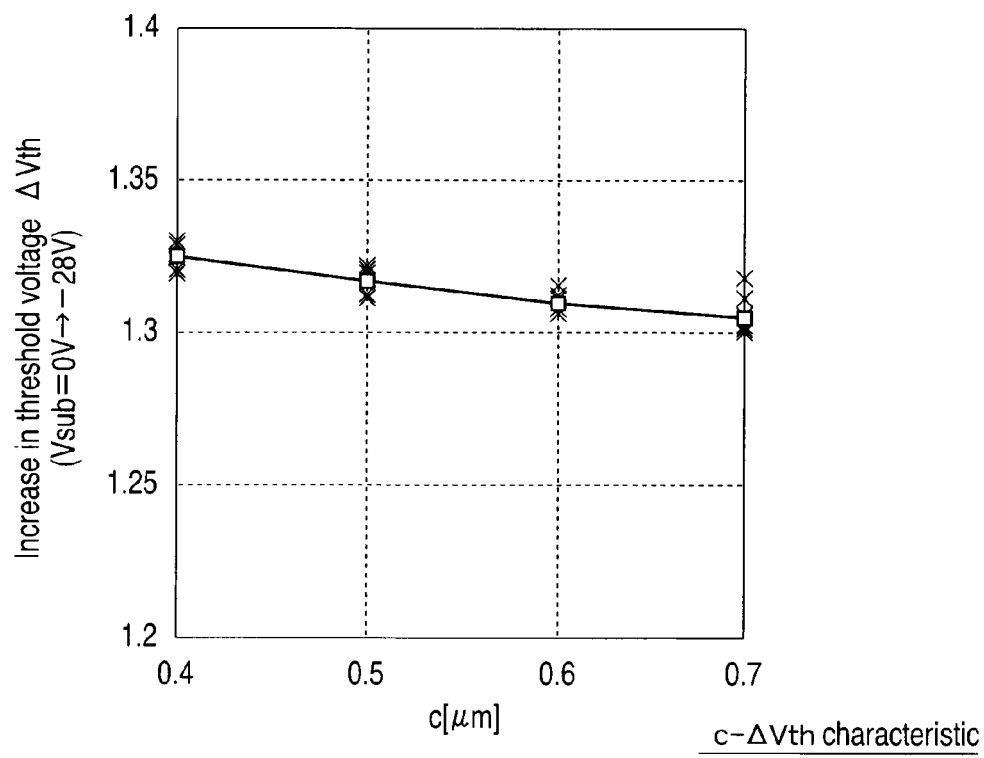
F I G. 2 3

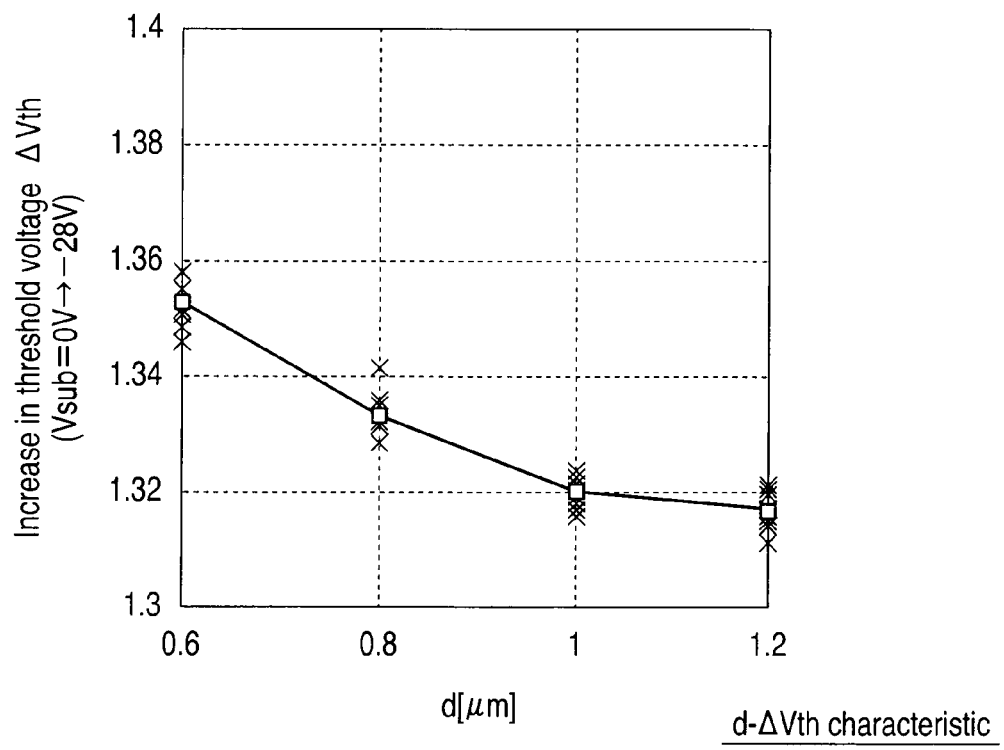
F I G. 28
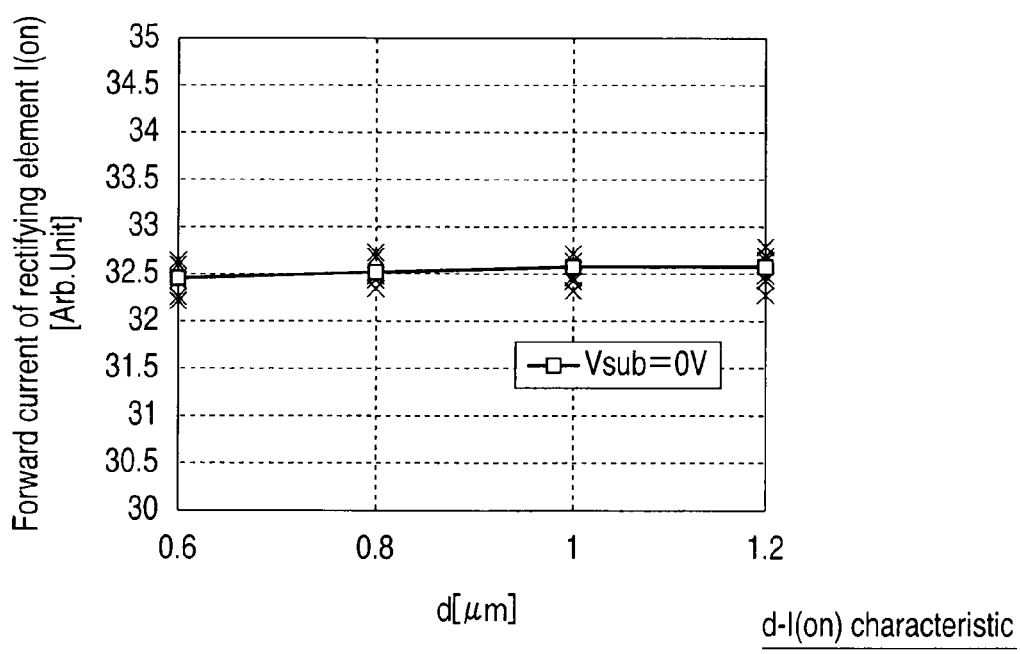
F I G. 29

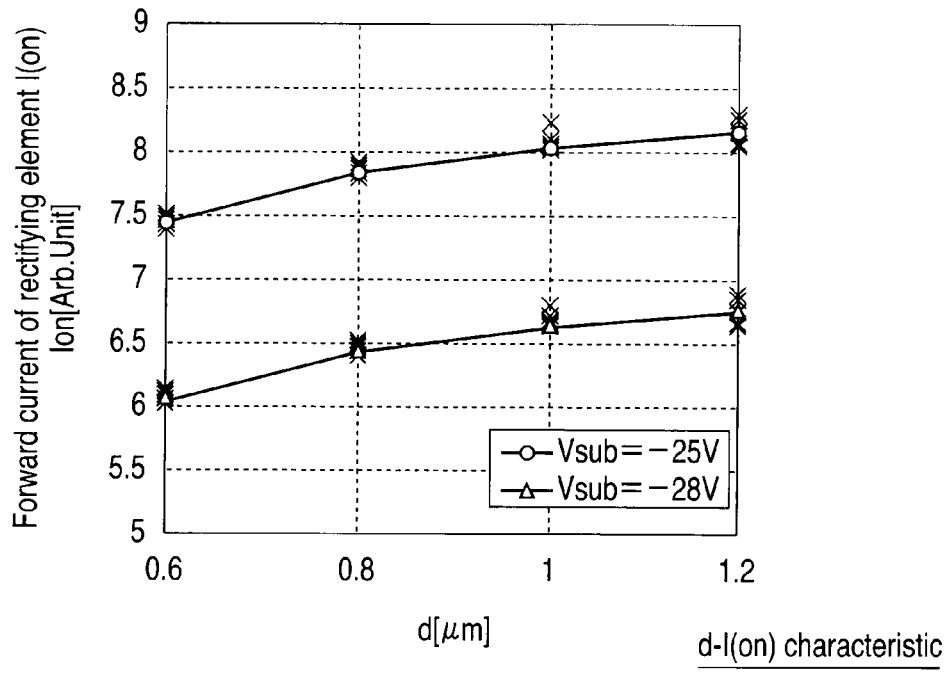
F I G. 30
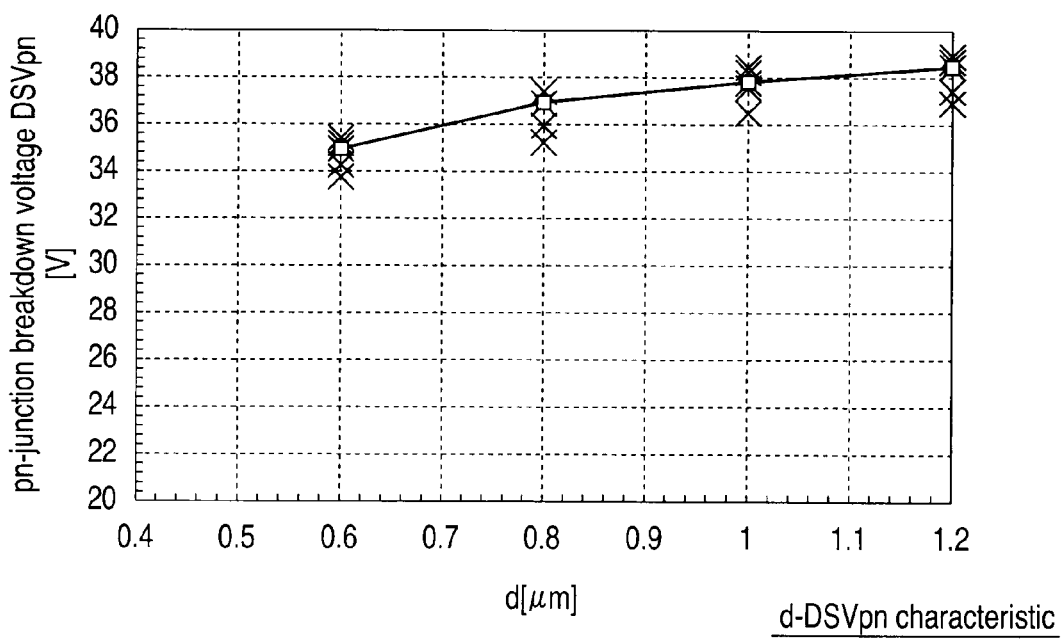
F I G. 31

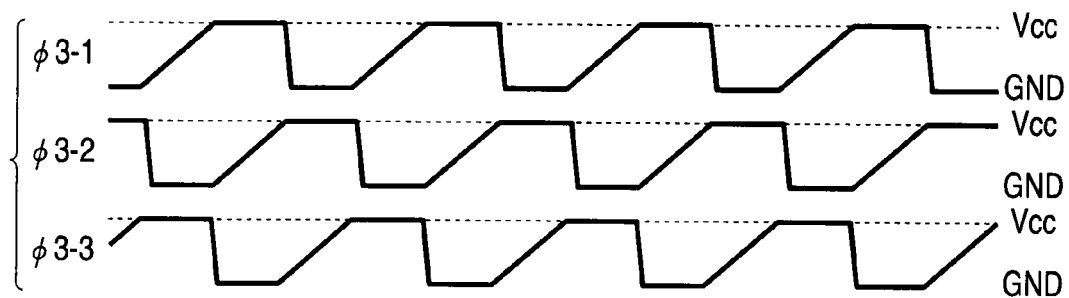
F I G. 3 4
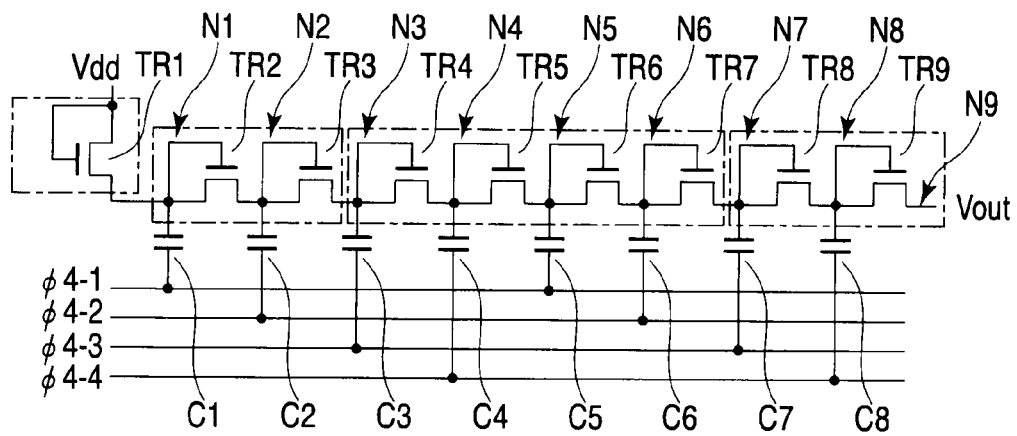
F I G. 3 5

SEMICONDUCTOR DEVICE INCLUDING MEMORY CELL HAVING CHARGE ACCUMULATION LAYER

CROSS-REFERENCE TO RELATED APPLICATIONS

This application is a continuation of and claims the benefit of priority under 35 U.S.C. §120 from U.S. Ser. No. 12/326,482 filed Dec. 2, 2008 now U.S. Pat. No. 7,872,289, and claims the benefit of priority under 35 U.S.C. §119 from Japanese Patent Application No. 2007-317582 filed Dec. 7, 2007, the entire contents of each of which are incorporated herein by reference.

BACKGROUND OF THE INVENTION

1. Field of the Invention

The present invention relates to a semiconductor device including a memory cell having a charge accumulation layer. For example, the invention relates to a configuration of a semiconductor device provided with a NAND type flash memory.

2. Description of the Related Art

Conventionally, an EEPROM (Electrically Erasable and Programmable Read Only Memory) is known as a nonvolatile semiconductor memory. Usually, the memory cell of an EEPROM has a MISFET structure including a stacked gate in which a charge accumulation layer and a control gate are stacked on a semiconductor substrate. Data is stored in the memory cell in a nonvolatile manner by a difference in threshold voltage between a state in which charges are injected in a charge accumulation layer and a state in which the charges are emitted.

In the NAND type EEPROM, electron injection into the charge accumulation layer (data write) and electron emission from the charge accumulation layer (data erase) are performed by a tunnel current which is passed through a tunnel insulation film provided between the charge accumulation layer and a semiconductor substrate. In a NOR type EEPROM, the electron emission from the charge accumulation layer is also performed by the tunnel current in order to be less affected by a short channel effect during the data erase.

The data erase is simultaneously performed on the plural memory cells in order to increase the number of memory cells erased per unit time. At this point a voltage not lower than 10V, for example, a positive voltage of 20V is applied to a well region where the memory cell is formed. On the other hand, during the data write, the well region is kept at 0V, and a voltage not lower than 10V is applied to a source and a drain. Therefore, the electric power necessary to charge and discharge the well region can be reduced to enhance the operation speed.

A charge pump circuit is used in an EEPROM in order to generate a high voltage not lower than 10V. For example, Jpn. Pat. Appln. KOKAI Publication Nos. 2001-231248, 2003-33008, 2003-51550, and 2003-102166 disclose charge pump circuits. Such charge pump circuits have a configuration in which plural rectifying elements are series-connected, and each rectifying element is formed by using an n-type MOS transistor in which a drain and a gate are connected.

In the charge pump circuit having the above-described configuration, a threshold voltage of a MOS transistor, which functions a certain rectifying element, is higher than that of a MOS transistor, which functions a preceding-stage rectifying element. As a result, in the series connection of the rectifying elements, boosting performance is lowered as the rectifying element is located in a later stage (as being closer to an output node). Therefore, in order to secure a sufficiently-boosted voltage, unfortunately, the number of stages of the rectifying element is increased, which enlarges the circuit area.

BRIEF SUMMARY OF THE INVENTION

A semiconductor device according to an aspect of the present invention includes:

element regions each of which is surrounded by an element isolation region;

MOS transistors each of which is formed on a first one of the element regions, each of the MOS transistors having a source, a drain, and a gate;

capacitor elements each of which is formed on a second one of the element regions;

a voltage generating circuit in which current paths of the MOS transistors are series-connected and each of the capacitor elements is connected to either of the source and the drain of each of the MOS transistors, the voltage generating circuit outputting a voltage from a first one of the MOS transistors in a final stage of the series connection, the voltage generating circuit inputting a voltage from a second one of the MOS transistors in the initial stage in the series connection;

a contact plug which is formed on at least either of the source and the drain to connect the MOS transistors or one of the MOS transistors and one of the capacitor elements, a distance between the gate and the contact plug both for the first one of the MOS transistors being larger than that for the second one of the MOS transistors; and a memory cell which is capable of holding data, the voltage output by the voltage generating circuit is applied to the memory cell.

BRIEF DESCRIPTION OF THE SEVERAL VIEWS OF THE DRAWING

FIG. 1 is a block diagram showing a flash memory according to a first embodiment of the invention;

FIG. 4 to FIG. 7 are plan views showing MOS transistors TR1, TR2, TR4, and TR9 according to the first embodiment, respectively;

FIG. 9 is a sectional view taken along a line 9-9 of FIG. 7;

FIG. 11 is a graph showing distances a to d and a gate length g in MOS transistors TR1 to TR9 according to the first embodiment;

FIG. 14 is a sectional view showing the flash memory according to the first embodiment;

FIG. 20 is a graph showing a relationship between the distance a and a surface breakdown voltage;

FIG. 21 is a graph showing a relationship between the distance b and the pn-junction breakdown voltage;

FIG. 22 is a graph showing a relationship between the distance b and the surface breakdown voltage;

FIG. 23 is a graph showing a relationship between the distance c and the increase in threshold voltage;

FIG. 28 is a graph showing a relationship between the distance d and the increase in threshold voltage;

FIGS. 29 and 30 are graphs showing a relationship between the distance d and the forward current;

FIG. 31 is a graph showing a relationship between the distance d and the pn-junction breakdown voltage;

FIG. 34 is a timing chart showing a voltage at each node of the charge pump circuit according to the second embodiment;

FIG. 35 is a circuit diagram showing a charge pump circuit according to a third embodiment of the invention;

DETAILED DESCRIPTION OF THE INVENTION

First Embodiment

Figure 2:
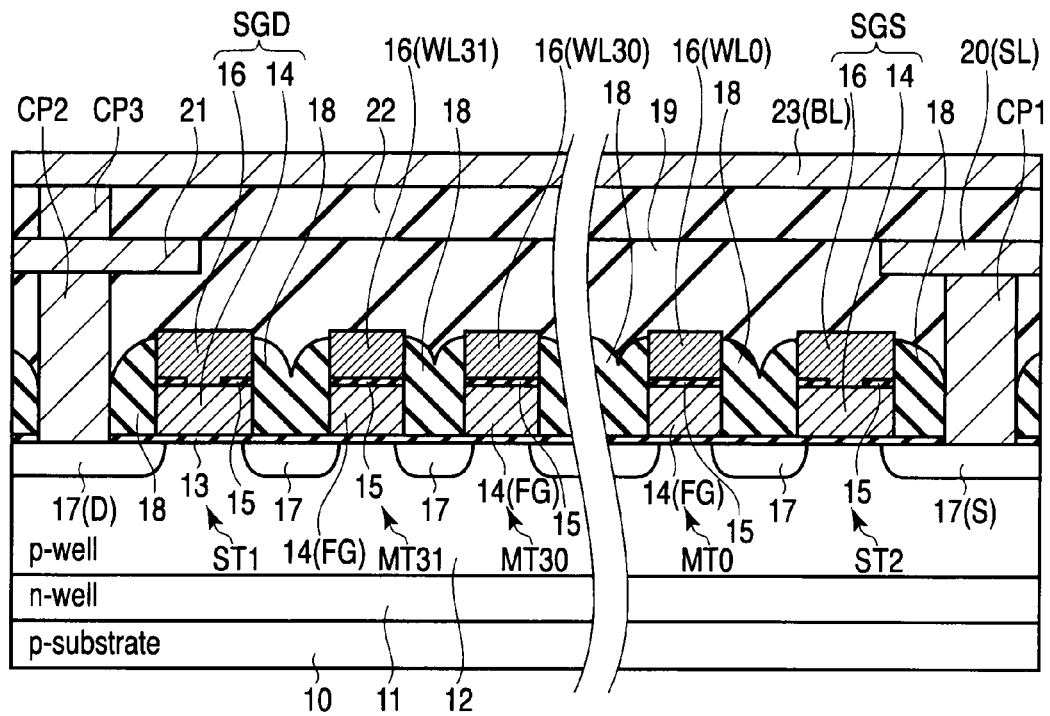
FIG. 2 is a sectional view showing a memory cell array according to the first embodiment.

A semiconductor device according to a first embodiment of the invention will be described below.

FIG. 1 is a block diagram showing a configuration of a part of a NAND type flash memory according to the first embodiment.

<Entire Configuration of NAND Type Flash Memory>

Referring to FIG. 1, the NAND type flash memory 1 includes a memory cell array 2, a row decoder 3, a voltage generating circuit 4, and a control circuit 5.

The memory cell array 2 includes plural memory cell transistors MT, and the data can be retained in each of the memory cell transistors MT. Each of the memory cell transistors MT includes a stacked gate in which a charge accumulation layer and a control gate are stacked. The charge accumulation layer can retain charges. The control gate is formed on the charge accumulation layer. In each memory cell transistor MT, the control gate is connected to a word line WL, a drain is electrically connected to a bit line EL, and a source is electrically connected to a source line SL.

The row decoder 3 selects a row direction of the memory cell array 2 according to an address input from the outside. During the data write, the row decoder 3 selects any of the word lines WL, the row decoder 3 applies a program voltage VPGM (for example, 20V) to the selected word line, and the row decoder 3 applies an intermediate voltage VPASS to the unselected word lines. During the data read, the row decoder 3 selects any of the word lines WL, the row decoder 3 applies a readout voltage VCGR to the selected word line, and the row decoder 3 applies a voltage VREAD to the unselected word lines. Both the voltages VPASS and VREAD are voltages which turn on the memory cell transistor MT. During the data erase, the row decoder 3 applies 0V to all the word lines WL, and the row decoder 3 applies a high voltage (for example, 20V) to a well region on which the memory cell array 2 is formed.

The voltage generating circuit 4 generates the required voltage and supplies the required voltage to the row decoder 3. That is, the voltage generating circuit 4 includes plural charge pump circuits 6. The voltage generated by the charge pump circuit 6 is supplied to the row decoder 3 as the voltage VPGM or voltage VPASS.

The control circuit 5 receives the address and a command from the outside. The control circuit 5 controls the voltage generating circuit 4 according to the received command or address, and the control circuit 5 issues the command to the voltage generating circuit 4 to generate the required voltage.

<Configuration of Memory Cell Array>

A detailed configuration of the memory cell array 2 will be described below.

<<Circuit Configuration>>

A circuit configuration of the memory cell array 2 will be described. As shown in FIG. 1, the memory cell array 2 has plural NAND cells. Only the NAND cells of one row are shown in FIG. 1.

Each of the NAND cells includes 32 memory cell transistors MT0 to MT31 and selection transistors ST1 and ST2. For the sake of simple explanation, sometimes the memory cell transistors MT0 to MT31 are simply referred to as memory cell transistor MT. The memory cell transistor MT has a stacked gate structure. The stacked gate structure includes a charge accumulation layer (for example, floating gate) which is formed on a semiconductor substrate with a gate insulation film interposed therebetween, and a control gate electrode which is formed on a floating gate with an inter-gate insulation film interposed therebetween. The number of memory cell transistors MT is not limited to 32, and the NAND cells may include 8, 16, 64, 128, and 256 memory cell transistors, but such numbers are not limiting. The source and the drain are shared by the memory cell transistors MT adjacent to each other. The memory cell transistors MT are arranged such that current paths of the memory cell transistors MT are series-connected between the selection transistors ST1 and ST2. Drain region at one end of the series-connected memory cell transistors MT is connected to the source region of the selection transistor ST1, and the source region on the other end are connected to the drain region of the selection transistor ST2.

Control gate electrodes of the memory cell transistors MT located in the same row are commonly connected to any of the word lines WL0 to WL31, and the gates of the selection transistors ST1 and ST2 located in the same row are commonly connected to select gate lines SGD and SGS, respectively. The drains of the selection transistors ST1 located in the same column in the memory cell array are commonly connected to one of the bit lines BL0 to BLn (n is a natural number). For the sake of simple explanation, sometimes the word lines WL0 to WL31 and the bit lines BL0 to BLn are simply referred to as word line WL and bit line BL, respectively. The sources of the selection transistors ST2 are commonly connected to the source line SL. Both the selection transistors ST1 and ST2 are not always required, and solely one of the selection transistors ST1 and ST2 may be provided, as long as the NAND cell can be selected.

Only the NAND cells of one row are shown in FIG. 1. However, the NAND cells of plural rows are arranged in the memory cell array 2, and the NAND cells located in the same row are connected to the same bit line BL. The data is collectively written in the memory cell transistors MT connected to the same word line WL, and this unit is called one page. The data is collectively erased in the plural NAND cells, and this unit is called a block.

<<Sectional Configuration>>

A sectional configuration of the NAND cell will be described with reference to FIG. 2. FIG. 2 is a sectional view along the bit line direction of the NAND cell.

As shown in FIG. 2, an n-type well region 11 is formed in a surface region of a p-type semiconductor substrate 10, and a p-type well region 12 is formed in a surface region of the n-type well region 11. A gate insulation film 13 is formed on the well region 12. The gate insulation film 13 is formed by a silicon oxide film having a film thickness of 4 nm to 12 nm or a silicon oxynitride film having a film thickness of 4 nm to 12 nm, and the gate insulation film 13 functions as a tunnel oxide film. The gate electrodes of the memory cell transistor MT and selection transistors ST1 and ST2 are formed on the gate insulation film 13.

Each of the gate electrodes of the memory cell transistor MT and selection transistors ST1 and ST2 includes a polycrystalline silicon layer 14 which is formed on the gate insulation film 13, an inter-gate insulation film 15 which is formed on the polycrystalline silicon layer 14, and a polycrystalline silicon layer 16 which is formed on the inter-gate insulation film 15. The polycrystalline silicon layer 14 is a conductive film in which, for example, phosphorus or arsenic is doped with a concentration of $10^{18}$ cm$^{-3}$ to $10^{21}$ cm$^{-3}$. The polycrystalline silicon layer 14 has a film thickness of 10 nm to 500 nm. For example, the inter-gate insulation film 15 is formed by a silicon oxide film, an oxynitride film, an ON film, an NO film, or an ONO film, a stacked structure thereof, a single layer film made of $Al_2O_3$, $HfSi_x$, $AlSi_x$, $HfO_x$, or $TiO_x$, or a stacked film of at least any of $Al_2O_3$, $HfSi_x$, $AlSi_x$, $HfO_x$, and $TiO_x$ and a high-dielectric film including the silicon oxide film, the silicon nitride film, and the silicon oxynitride film. Each of the ON film, the NO film and the ONO film is a stacked structure of the silicon oxide film and a silicon nitride film. The inter-gate insulation film 15 has a film thickness of 5 nm to 30 nm. The polycrystalline silicon layer 16 is a conductive film in which, for example, phosphorus, arsenic, or boron is doped with a concentration of $10^{17}$ cm$^{-3}$ to $10^{21}$ cm$^{-3}$. The polycrystalline silicon layer 16 may be replaced by a silicide layer. In such cases, WSi (tungsten silicide), NiSi, MoSi, TiSi, and CoSi can be used as the silicide layer. The polycrystalline silicon layer may be replaced by a stacked film of the polycrystalline silicon layer and the silicide layer. For example, the silicide layer has a film thickness of 10 nm to 500 nm. The silicon oxide film or the silicon nitride film may be formed on the polycrystalline silicon layer 16.

In the memory cell transistor MT, the polycrystalline silicon layer 14 functions as the floating gate (FG). On the other hand, the polycrystalline silicon layers 16, which are adjacent to each other in a direction orthogonal to the bit line, are commonly connected, and the polycrystalline silicon layer 16 functions as the control gate electrode (word line WL). In the selection transistors ST1 and ST2, the polycrystalline silicon layers 14 and 16, which are adjacent to each other in a word-line direction, are commonly connected, and the polycrystalline silicon layers 14 and 16 function as the select gate lines SGS and SGD. Only the polycrystalline silicon layer 14 may function as the select gate line. In such cases, potentials at the polycrystalline silicon layers 16 of the selection transistors ST1 and ST2 are kept constant or set in a floating state.

An n-type impurity diffusion layer 17 is formed in a surface of the semiconductor substrate 10 located between the gate electrodes. The impurity diffusion layer 17 is shared by the transistors adjacent to each other, and the impurity diffusion layer 17 functions as the source (S) or the drain (D). The impurity diffusion layer 17 contains phosphorus, arsenic, or antimony, the impurity diffusion layer 17 has a surface concentration of $10^{17}$ cm$^{-3}$ to $10^{20}$ cm$^{-3}$, and a junction depth of the impurity diffusion layer 17 is 10 nm to 300 nm. A region between the source and drain adjacent to each other functions as a channel region which is the electron moving region.

Thus, the MOS transistor functioning as the memory cell transistor MT and selection transistors ST1 and ST2 is formed by the gate electrode, the impurity diffusion layer 17, and the channel region.

A sidewall insulation film 18 is formed on a sidewall of the gate electrode. The sidewall insulation film 18 is implanted in a gap between the gate electrodes of the memory cell transistor MT adjacent to each other and a gap between the gate electrodes of the memory cell transistor MT and selection transistors ST1 or ST2 adjacent to each other. An inter-layer insulation film 19 is formed on the semiconductor substrate 10 such that the memory cell transistor MT and the selection transistors ST1 and ST2 are covered therewith. The inter-layer insulation film 19 is formed by the silicon oxide film, the silicon nitride film, silicate glass such as BPSG (Boron Phosphorous Silicate glass), BSG, and PSG, HSQ (Hydrogen Silses Quioxane), MSQ (Methyl Silses Quioxane), or SiLK (registered trademark). That is, after the insulation film having a film thickness of 100 nm or larger to 1 μm or smaller is deposited on the semiconductor substrate using the above-described material, planarization is performed by a CMP method to complete the inter-layer insulation film 19.

A contact plug CP1 is formed in the inter-layer insulation film 19, and the contact plug CP1 reaches the impurity diffusion layer (source) 17 of the selection transistor ST2 on the source side. A metal interconnection layer 20 connected to the contact plug CP1 is formed in the surface of the inter-layer insulation film 19. The metal interconnection layer 20 functions as the source line SL. A contact plug CP2 is formed in the inter-layer insulation film 19, and the contact plug CP2 reaches the impurity diffusion layer (drain) 17 of the selection transistor ST1 on the drain side. A metal interconnection layer 21 connected to the contact plug CP2 is formed in the surface of the inter-layer insulation film 19.

An inter-layer insulation film 22 is formed on the inter-layer insulation film 19 such that the metal interconnection layer 21 is covered therewith. A contact plug CP3 is formed in the inter-layer insulation film 22, and the contact plug CP3 reaches the metal interconnection layer 21. A metal interconnection layer 23 is formed on the inter-layer insulation film 22, and the plural contact plugs CP3 are commonly connected to the metal interconnection layer 23. The metal interconnection layer 23 functions as the bit line BL.

<Configuration of Charge Pump Circuit in Voltage Generating Circuit>

The charge pump circuit 6 included in the voltage generating circuit 4 will be described in detail.

<<Circuit Configuration>>

Figure 3:
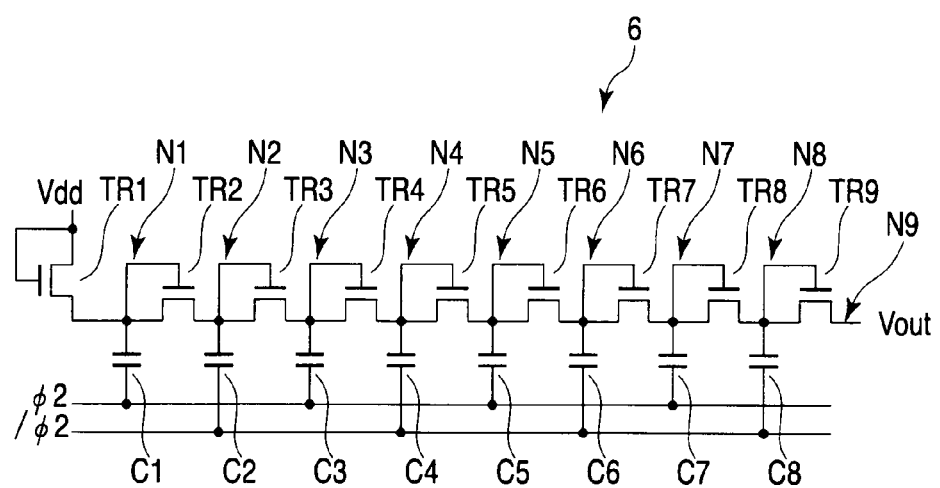
FIG. 3 is a circuit diagram showing a charge pump circuit according to the first embodiment.
Figure 5:
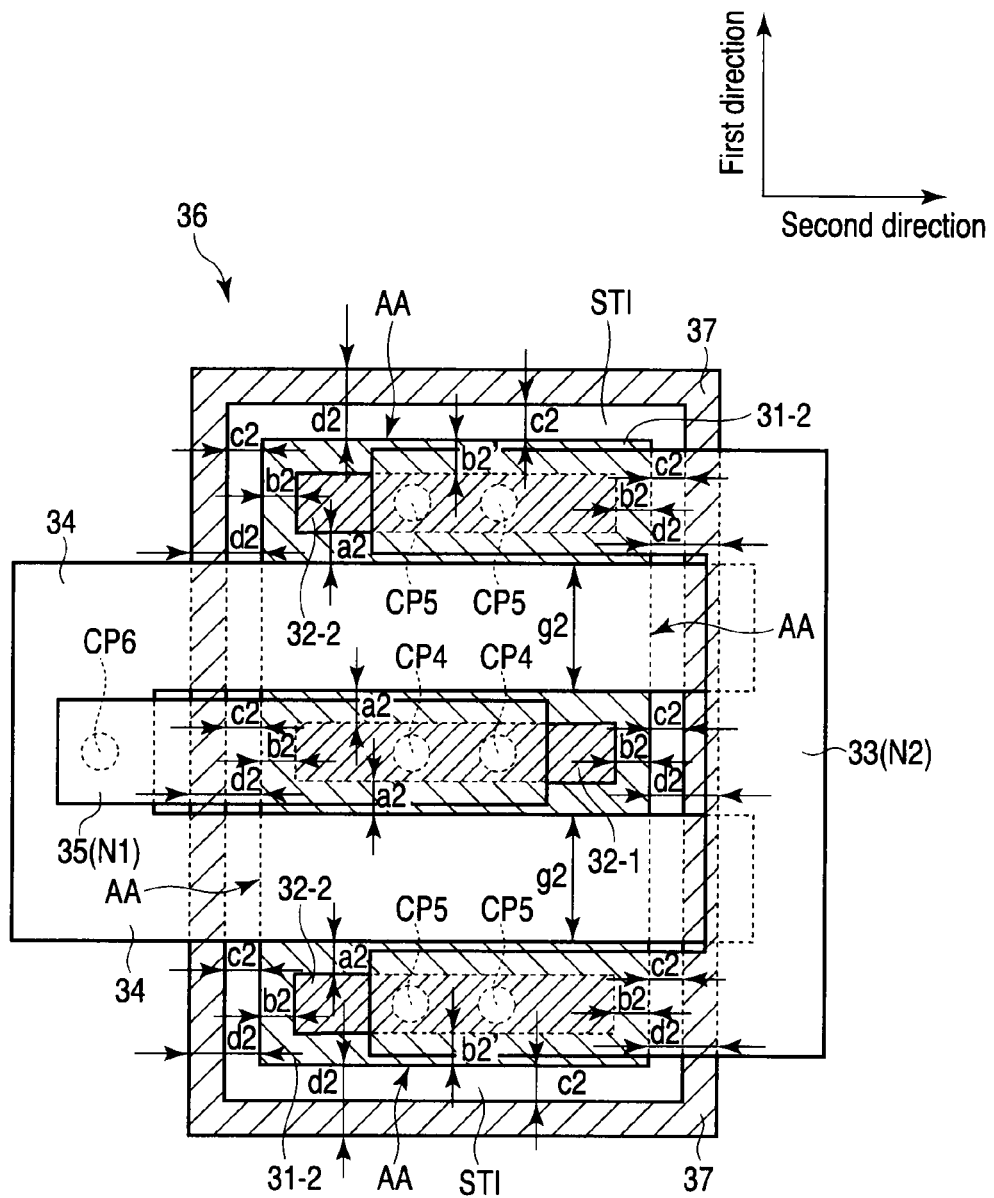

A circuit configuration of the charge pump circuit 6 included in the voltage generating circuit 4 will be described with reference to FIG. 3. FIG. 3 is a circuit diagram of the charge pump circuit 6.

Figure 6:
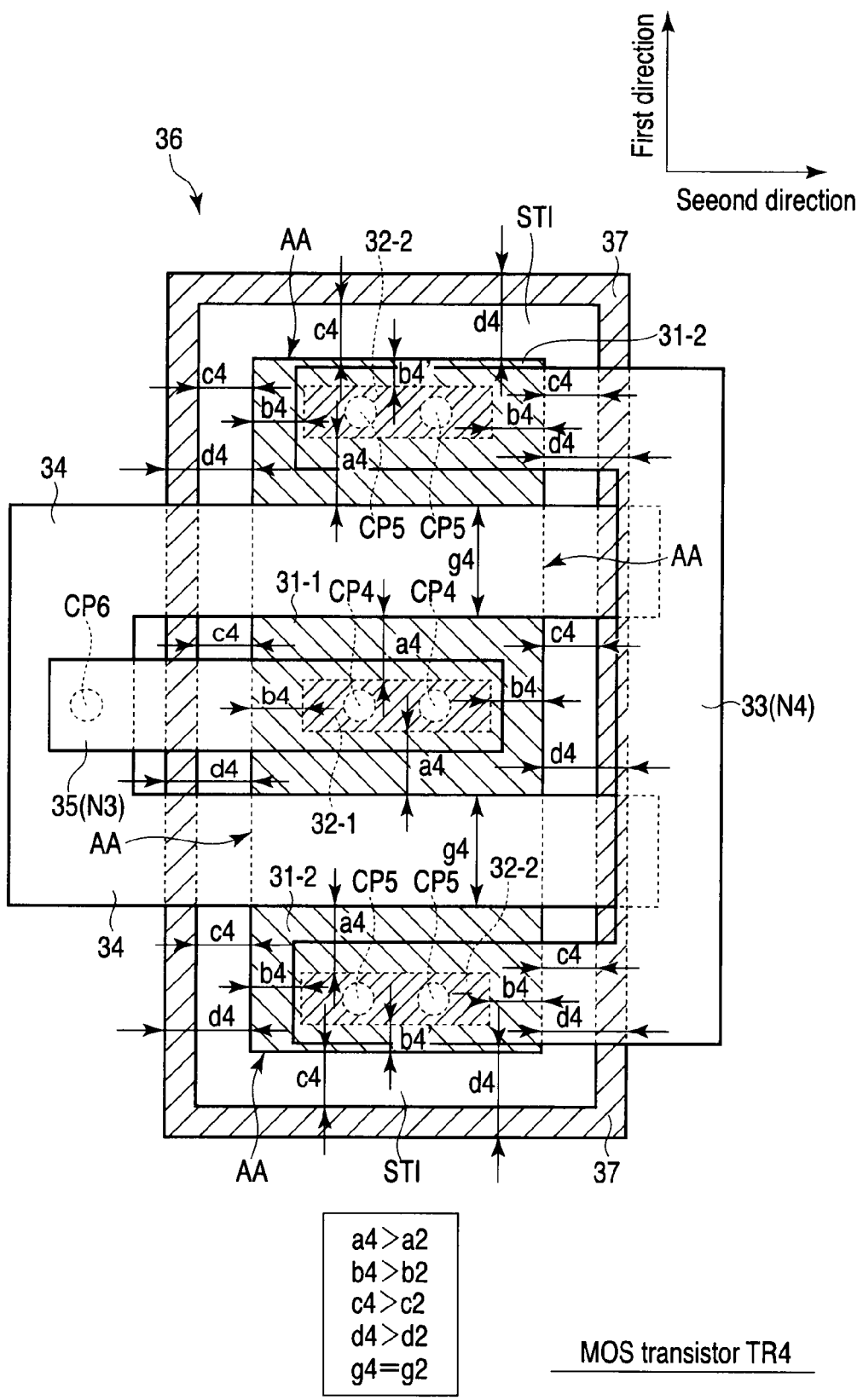

Referring to FIG. 6, the charge pump circuit 6 includes nine n-channel MOS transistors TR1 to TR9 and eight capacitor elements C1 to C8. The numbers of MOS transistors and capacitor elements are not limited to the first embodiment, but it is only necessary to provide at least three capacitor elements. In the following description, sometimes the MOS transistors TR1 to TR9 and the capacitor elements C1 to C8 are simply referred to as MOS transistor TR and capacitor element C when the capacitor elements C1 to C8 are not distinguished from one another.

In the MOS transistor TR1, either of the source and the drain is connected to the gate and connected to a power supply potential Vdd. In the MOS transistor TR2, either of the source and the drain is connected to the gate (hereinafter the connection node is referred to as node N1), and connected to the other of the source and the drain of the MOS transistor TR1. In the MOS transistor TR3, either of the source and the drain is connected to the gate (hereinafter the connection node is referred to as node N2), and connected to the other of the source and the drain of the MOS transistor TR2. In the MOS transistor TR4, either of the source and the drain is connected to the gate (hereinafter the connection node is referred to as node N4), and connected to the other of the source and the drain of the MOS transistor TR3. In the MOS transistor TR5, either of the source and the drain is connected to the gate (hereinafter the connection node is referred to as node N5), and connected to the other of the source and the drain of the MOS transistor TR4. In the MOS transistor TR6, either of the source and the drain is connected to the gate (hereinafter the connection node is referred to as node N6), and connected to the other of the source and the drain of the MOS transistor TR5. In the MOS transistor TR7, either of the source and the drain is connected to the gate (hereinafter the connection node is referred to as node N7), and connected to the other of the source and the drain of the MOS transistor TR6. In the MOS transistor TR8, either of the source and the drain is connected to the gate (hereinafter the connection node is referred to as node N8), and connected to the other of the source and the drain of the MOS transistor TR7. In the MOS transistor TR9, either of the source and the drain is connected to the gate (hereinafter the connection node is referred to as node N8), and connected to the other of the source and the drain of the MOS transistor TR8. The node of other of the source and the drain of the MOS transistor TR9 (hereinafter the connection node is referred to as node N9) functions as an output node of an output voltage Vout. That is, the MOS transistor TR is operated as a rectifying element in which either of the source and the drain functions as an anode while the other functions as a cathode.

One of electrodes of each of capacitor elements C1, C3, C5, and C7 is connected to each of the nodes N1, N3, N5, and N7, and a clock $\phi 2$ is input into the other electrode. One of electrodes of each of capacitor elements C2, C4, C6, and C8 is connected to each of the nodes N2, N4, N6, and N8, and a clock $/\phi 2$ is input into the other electrode. The clock $/\phi 2$ is the inversion signal of the clock $\phi 2$.

The charge pump circuit 6 includes series-connected rectifying elements, and the clock $\phi 2$ is input into the input nodes of the even-numbered rectifying elements (MOS transistors TR2, TR4, TR6, . . . ) through the capacitor elements Cj (j=1, 3, 5, . . . ). On the other hand, the clock $/\phi 2$ is input into the input nodes of the odd-numbered rectifying elements (MOS transistor TR3, TR5, . . . ) from the third stage through the capacitor elements C(j+1).

<<Plane Configuration of MOS Transistor TR>>

A plane configuration of the MOS transistor TR included in the charge pump circuit 6 will be described with reference to FIGS. 4 to 7. FIGS. 4 to 7 are plan views showing the MOS transistors TR1, TR2, TR4, and TR9, respectively.

The MOS transistors TR1 to TR9 are formed on the semiconductor substrate 10 on which the memory cell array 2 is formed. The configurations of the MOS transistors TR1 to TR9 are basically identical to one another, the configurations of the MOS transistors TR1 to TR9 will collectively be described below.

As shown in FIGS. 4 to 7, each of the MOS transistors TR is formed on an element region AA provided in the semiconductor substrate 10. The element region AA is surrounded by an element isolation region STI, and the element regions AA are electrically separated from each other. Three n-type impurity diffusion layers 31 are formed in each element region AA. The three diffusion layers 31 are arranged in a first direction in the surface of the semiconductor substrate separated from one another. The diffusion layers 31 functions as an LDD (Lightly Doped Drain) region for the source or drain region of the MOS transistor TR. In the first embodiment, the diffusion layer 31 sandwiched between the two diffusion layers 31 in the first direction functions as either of the source and the drain (the side connected to the Vdd node or capacitor element C(i−1) in the MOS transistor TRi (i is a natural number of 2 to 9)), and the remaining two diffusion layers 31 function as the other (side connected to the capacitor element Cj or output node in the MOS transistor TRj (j is a natural number of 1 to 9)). In the case of necessity of distinction, sometimes the diffusion layer 31, which functions as either of the source and the drain, is referred to as diffusion layer 31-1 and the diffusion layer 31, which functions as the other, is referred to as diffusion layer 31-2.

An n-type impurity diffusion layer 32 having an impurity concentration higher than that of the diffusion layer 31 is formed in the diffusion layer 31. In the case of necessity of distinction, sometimes the diffusion layers 32 formed in the diffusion layers 31-1 and 31-2 are referred to as diffusion layers 32-1 and 32-2, respectively.

Contact plugs CP4 and CP5 are formed on the diffusion layers 32-1 and 32-2, respectively. That is, the diffusion layer 32 is provided in order to reduce contact resistances between the source and drain in the MOS transistor TR and the contact plugs CP4 and CP5. A metal interconnection layer 33 is formed on the contact plug CP5. The two diffusion layers 32-2 are electrically connected to each other by the metal interconnection layer 33. That is, the metal interconnection layer 33 functions as the node Ni in the MOS transistor TRi.

A gate electrode 34 is formed as a strip in a second direction, orthogonal to the first direction, between the diffusion layers 31-1 and 31-2 which are adjacent to each other in the first direction. In the first embodiment, the two gate electrodes 34 are disposed because the three diffusion layers 31 are disposed. The two gate electrodes 34 are extracted onto the element isolation region STI, and the two gate electrodes 34 are commonly connected on the element isolation region STI.

A contact plug CP6 is formed on the gate electrode 34 on the element isolation region STI. The contact plugs CP6 and CP4 are connected to each other by a metal interconnection layer 35. Therefore, the diffusion layer 31-1 and the gate electrode 34 are electrically connected by the metal interconnection layer 35 and the contact plugs CP4 and CP6. That is, the metal interconnection layer 35 functions as the node N(i−1) of the MOS transistor TRi (the metal interconnection layer 35 functions as the Vdd node in the case of the MOS transistor TR1).

A p-type well region 36 is formed in a region immediately below the element isolation region STI surrounding the element region AA. A p-type region (p-type impurity diffusion layer) 37 is formed in the region immediately below the element isolation region STI and in a side surface of the well region 36. Accordingly, as shown in FIGS. 4 to 7, when the MOS transistor TR is viewed from above, the element region AA is surrounded by the element isolation region STI, the element isolation region STI is surrounded by the p-type region 37, and the p-type region 37 is surrounded by the well region 36.

Hereinafter a distance between the diffusion layer 32 and the gate electrode 34 adjacent thereto in the first direction (gate length direction: direction in which the source, the channel, and the drain are sequentially disposed) is referred to as distance a. A distance between the diffusion layer 32 and the element isolation region STI is referred to as distance b. For the distance b, in the case where the distance in the first direction and the distance in the second direction (gate width direction) are distinguished from each other, the distance b in the gate length direction is referred to as distance b'. A distance between the diffusion layer 31 and the p-type region 37 immediately below the element isolation region STI is referred to as distance c. A distance between the diffusion layer 31 and the well region 36 immediately below the element isolation region STI is referred to as distance d. A width (gate length) in the first direction of the gate electrode 34 is referred to as gate length g. In the case where the distances a to d and the gate length g are distinguished for the MOS transistor TRi, the distances a to d and the gate length g are referred to as distances ai to di and gate length gi, respectively.

Although the configurations of the MOS transistors TR1 to TR9 are similar to one another, the MOS transistors TR1 to TR9 differ from one another in the distances a to d and the gate length g. The distances a to d and the gate length g are described later.

<<Sectional Configuration of MOS Transistor TR>>

Figure 10:
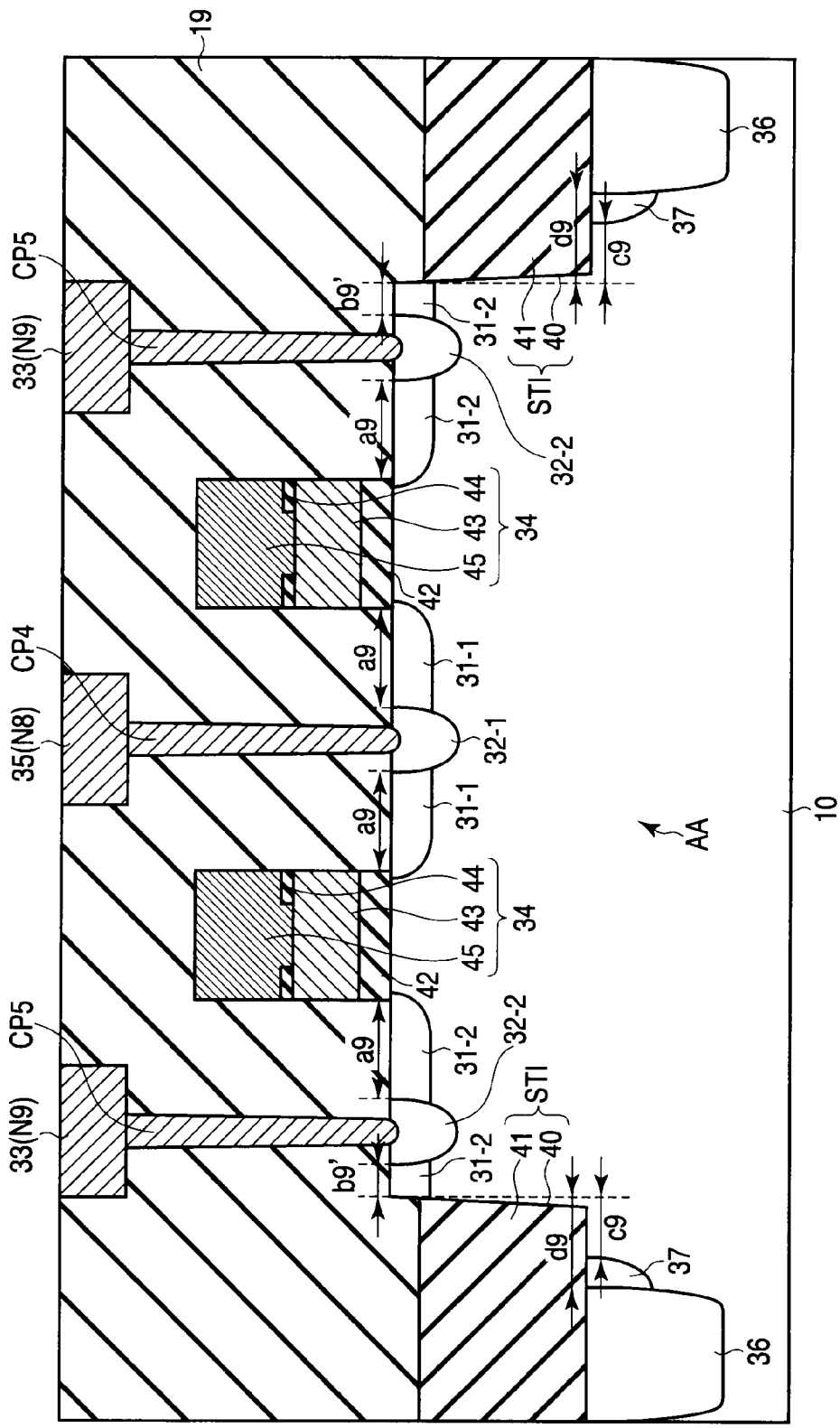
FIG. 10 is a sectional view taken along a line 10-10 in FIG. 7.

A sectional configuration of the MOS transistor TR included in the charge pump circuit 6 will be described with reference to FIGS. 8 to 10. FIGS. 8 to 10 are sectional views taken along a line 8-8, a line 9-9, and a line 10-10 in FIG. 7, respectively. Because the sectional configurations of the MOS transistors TR1 to TR9 are basically identical to one another, the MOS transistor TR9 will be described below by way of example.

As shown in FIGS. 8 to 10, the element isolation region STI is formed in the surface region of the semiconductor substrate (for example, silicon substrate) 10. The element isolation region STI includes a trench 40 which is formed in the semiconductor substrate 10 and an insulation film (for example, silicon oxide film) 41 buried in the trench 40. The trench 40 has a depth of about 0.1 μm to about 0.3 μm from the surface of the semiconductor substrate 10. The stripe-shape element region AA is formed along the first direction in the semiconductor substrate 10, and the element region AA is surrounded by the element isolation region STI.

The p-type impurity such as boron is doped in the semiconductor substrate 10, and the p-type impurity concentration ranges from $10^{14}$ cm$^{-3}$ to $5 \times 10^{16}$ cm$^{-3}$ at a depth of 1 μm from the surface. Therefore, when a back bias is set in a range of −1.5V to −5V, a threshold voltage of the MOS transistor TR can be set in a range of 0V to 2V.

The gate electrode 34 is formed on the element region AA with a gate insulation film 42 interposed therebetween. For example, the gate insulation film 42 is made of the silicon oxide film or silicon oxynitride film with film thicknesses range from 13 nm to 40 nm. When the gate insulation film 42 has a film thickness of 13 nm or larger, even if a voltage of 15V or higher is applied between the gate electrode 34 and the element region AA, generation of tunnel leakage current can be prevented, therefore the reliability deterioration of the MOS transistor TR is suppressed.

The gate electrode 34 has a stacked structure. The gate electrode 34 and the stacked gate of the memory cell transistor MT are simultaneously formed. The gate electrode 34 includes a first conductive layer 43 which is formed on the gate insulation film 42, a block insulation film 44 which is formed on the conductive layer 43, and a second conductive layer 45 which is formed on the block insulation film 44.

The first conductive layer 43 is made of the same material as the floating gate of the memory cell transistor MT, and the first conductive layer 43 and the floating gate of the memory cell transistor MT are simultaneously formed. That is, the first conductive layer 43 and the floating gate of the memory cell transistor MT are made of conductive polycrystalline silicon in which phosphorus or arsenic is doped with a concentration of $10^{18}$ cm$^{-3}$ to $10^{21}$ cm$^{-3}$. The first conductive layer 43 and the floating gate of the memory cell transistor MT have film thicknesses of 10 nm to 500 nm.

Similarly to the floating gate, the first conductive layer 43 is formed in the element region partitioned by the element isolation region STI, both end portions in the gate width direction are brought into contact with the insulation film 41 of the element isolation region STI. The configuration can be formed as follows.

The n-type well region 11 is formed in the surface of the semiconductor substrate 10 by ion injection, and the p-type well region 12 is formed by ion injection. Then the gate insulation film 13 of the memory cell transistor MT, the gate insulation film 42 of the MOS transistor TR, and the film (polycrystalline silicon layers 14 and 43) forming the floating gate are deposited on the substrate 10. The gate insulation films 13 and 42 and the polycrystalline silicon layers 14 and 43 are patterned, and the semiconductor substrate 10 is etched to a depth of 0.1 μm to 0.3 μm to form the trench. Then the insulating material, such as a silicon oxide film, is buried in the trench to form the element isolation region STI. Therefore, the floating gate and the first conductive layer 43 can be formed on a flat surface having no step.

The block insulation film 44 is made of the same material as the inter-gate insulation film 15 of the memory cell transistor MT through the same process. Examples of materials for the block insulation film 44 with a film thickness of 5 nm to 30 nm include a silicon oxide film, oxynitride film, and stacked film of silicon oxide film/silicon nitride film/silicon oxide film. Examples of materials for the block insulation film 44 also include a single layer film made of any of $Al_2O_3$, $HfSi_x$, $AlSi_x$, $HfAlO_x$, $HfO_x$, and $TiO_x$, and a stacked film of at least any of $Al_2O_3$, $HfSi_x$, $AlSi_x$, $HfAlO_x$, $HfO_x$, and $TiO_x$ and a high-dielectric film including a silicon oxide film, silicon nitride film, and silicon oxynitride film.

The second conductive layer 45 is made of the same material as the control gate 16 of the memory cell transistor MT through the same process. Examples of materials for the second conductive layer 45 include a conductive polycrystalline silicon layer in which phosphorus, arsenic, or boron is doped with a concentration of $10^{17}$ cm$^{-3}$ to $10^{21}$ cm$^{-3}$, a stacked structure film of WSi (tungsten silicide) and polycrystalline silicon layer, a stacked structure film of one of W, WN, NiSi, MoSi, TiSi, and CoSi and a polycrystalline silicon layer, an NiSi film, a MoSi film, a TiSi film, and a CoSi film. The example of a film thickness of the second conductive layer 45 is 10 nm to 500 nm. Similarly to the control gate 16, the silicon oxide film or the silicon nitride film may be formed on the second conductive layer 45. A part of the block insulation film 44 is removed, and the first conductive layer 43 and the second conductive layer 45 are connected in the removed region. The second conductive layer 45 is formed in the second direction up to the element isolation region STI across the element region AA. The two gate electrodes 34 are commonly connected through the second conductive layer 45 (see FIG. 8) formed on the element isolation region STI.

The n-type impurity diffusion layer 31 is formed in the surface region of the element region AA, and the n-type impurity diffusion layer 31 functions as the LDD region of the source and drain of the MOS transistor TR. Similarly to the source and drain region 17 of the memory cell transistor MT, the diffusion layer 31 contains phosphorus, arsenic, or antimony such that the surface region of the diffusion layer 31 has a concentration of $10^{17}$ cm$^{-3}$ to $10^{20}$ cm$^{-3}$, and the diffusion layer 31 has a junction depth of 10 nm to 300 nm. The diffusion layer 31 is formed in a self-aligned fashion with respect to the gate electrode 34.

The n-type impurity diffusion layer 32 is formed near a central portion of the diffusion layer 31 (see FIG. 10), and the n-type impurity diffusion layer 32 pierces through the diffusion layer 31 from the surface of the diffusion layer 31. The diffusion layer 32 contains an impurity having a concentration higher than that of the diffusion layer 31. For example, the diffusion layer 32 contains phosphorus, arsenic, or antimony such that the surface region of the diffusion layer 32 has a concentration of $10^{18}$ cm$^{-3}$ to $10^{22}$ cm$^{-3}$, and the diffusion layer 32 has a junction depth of 40 nm to 500 nm. The diffusion layer 32 is formed deeper than the diffusion layer 31, and the diffusion layer 32 has a resistance lower than that of the diffusion layer 31. As described above, the diffusion layer 32 is needed in order to reduce the contact resistances for the source and drain, and the diffusion layer 32 differs from the LDD region 31 in the peak concentration of the diffusion impurities. The diffusion layer 32 has a peak concentration of $10^{20}$ cm$^{-3}$ or higher to $10^{22}$ cm$^{-3}$ while the LDD region 31 has a peak concentration of $10^{17}$ cm$^{-3}$ or higher to $10^{19}$ cm$^{-3}$ or lower.

The p-type well region 36 is formed in the semiconductor substrate 10 immediately below the element isolation region STI. The p-type well region 36 is provided in order to prevent punch-through between the element regions AA separated by the element isolation region STI located immediately above. Therefore, it is necessary that the resistance of the p-type well region 36 be set at a value sufficiently lower than that of the semiconductor substrate 10. The well region 36 has a depth of 0.5 μm to 1.6 μm from the surface of the semiconductor substrate 10, and the impurity contained in the well region 36 has the peak concentration of $10^{16}$ cm$^{-3}$ to $10^{18}$ cm$^{-3}$. For example, the well region 36 has a depth peak of about 1 μm. An end portion of the well region 36 is separated from an end portion of the element isolation region STI, and the distance d is the distance between the end portions. More particularly, the distance d is a distance of closest approach of the well region 36 and a boundary between the element isolation region STI and the element region AA in the surface of the semiconductor substrate 10 in the plane direction of the semiconductor substrate 10.

The p-type well region 37 is formed in the semiconductor substrate 10 immediately below the element isolation region STI and adjacent to the well region 36. The p-type well region 37 is provided in order to prevent a flowing a punch-through leakage current through the neighborhood of the bottom portion of the element isolation region STI. The well region 37 has a peak depth of 0 μm to 0.5 μm from the surface of the element isolation region STI, and the well region 37 contains an impurity having a peak concentration of $10^{16}$ cm$^{-3}$ to $10^{18}$ cm$^{-3}$. For example, the well region 36 has a depth peak of about 0.1 μm. An end portion of the well region 37 is separated from an end portion of the element isolation region STI, and the distance c is the distance between the end portions.

More particularly, the distance c is a distance of closest approach of the well region 37 and a boundary between the element isolation region STI and the element region AA in the surface of the semiconductor substrate 10 in the plane direction of the semiconductor substrate 10. The distance c is smaller than the distance d.

The MOS transistor TR is formed by the diffusion layers 31 and 32 and the gate electrode 34. The inter-layer insulation film 19 is formed on the semiconductor substrate 10 so as to cover the MOS transistor TR.

The contact plugs CP4 and CP5 and the contact plug CP6 are formed in the inter-layer insulation film 19, the contact plugs CP4 and CP5 reach the diffusion layers 32-1 and 32-2 respectively, and the contact plug CP6 reaches the second conductive layer 45. Each of the contact plugs CP4 to CP6 is formed by burying a conductive material in the contact hole reaching the diffusion layers 32-1 and 32-2 and the second conductive layer 45 from the surface of the inter-layer insulation film 19. For example, the contact hole has a diameter of 20 nm or larger to 200 nm or smaller. Polycrystalline silicon in which phosphorus or arsenic is doped is used as the conductive material buried in the contact hole. Alternatively, the conductive material includes a barrier metal layer made of Ti and TiN or TaN and a metal layer made of W or Cu.

The metal interconnection layers 33 and 35 are formed in the surface of the inter-layer insulation film 19. The metal interconnection layer 33 is connected to the contact plug CP5, and the metal interconnection layer 35 is connected to the contact plugs CP4 and CP6. The metal interconnection layers 33 and 35 are formed by the following method. A trench of 50 nm or lager to 500 nm or smaller is formed in the surface of the inter-layer insulation film 19. A barrier metal layer made of Ti and TiN or TaN is formed in the trench, and W or Cu is buried in the trench to complete the metal interconnection layers 33 and 35. Alternatively, etching may be performed into a desired pattern by RIE after W or Cu is deposited on the whole surface of the inter-layer insulation film 19.

<<Dimensions of MOS Transistor TR>>

The distances a to d and the gate length g relating to the MOS transistor TR having the above-described configuration will be described with reference to FIG. 11. FIG. 11 is a graph showing correspondence of the MOS transistors TR1 to TR9 and the distances a to d and the gate length g.

The distances a to d are increased as the MOS transistor TR is closer to the output node, i.e., the MOS transistor TR is in a later stage in the series connection of the MOS transistors TR. On the other hand, the gate length g is decreased, as the MOS transistor TR is located in a later stage in the series connection of the MOS transistors TR.

First the distance a will be described below. The distances a are equalized to one another in the MOS transistors TR1 to TR3. That is, a1=a2=a3. The distances a are equalized to one another in the MOS transistors TR4 to TR7, and the distances a of the MOS transistors TR4 to TR7 are set to be larger than the distances a of the MOS transistors TR1 to TR3. That is, a4=a5=a6=a7>a1 to a3. The distances a of the MOS transistors TR8 and TR9 are larger than the distances a of the MOS transistors TR1 to TR7.

For example, the distances a4 to a7 are set in the range of 0.5 μm to 1.2 μm. The distances a1 to a3 are smaller than the distances a4 to a7 by the range of 0.1 μm to 0.4 μm, and the distances a8 and a9 are smaller than the distances a4 to a7 by the range of 0.2 μm to 0.8 μm.

Next the distances b to d will be described. The distances b to d are equalized to one another in the MOS transistors TR1 to TR3. That is, b1=b2=b3, c1=c2=c3, and d1=d2=d3. The distances b to d are equalized to one another in the MOS transistors TR4 to TR9, and the distances b to d of the MOS transistors TR4 to TR9 are larger than the distances b to d of the MOS transistors TR1 to TR3. That is, b4=b5=b6=b7=b8=b9>b1 to b3, c4=c5=c6=c7=c8=c9>c1 to c3, and d4=d5=d6=d7=d8=d9>d1 to d3.

For example, the distances b1 to b3 are set in the range of 0 μm to 1.0 μm. The distances b4 to b9 are larger than the distances b1 to b3 by the range of 0.1 μm to 0.4 μm. The distances b1' and b2' are set at the same values as the distances b1 to b3. On the other hand, the distances b3' to b9' may be equal to the distances b1 to b3. However, the distances b3' to b9' may be larger than the distances b1 to b3 to keep the sufficient junction breakdown voltage. The distances b3' to b9' are set in the range of 0 μm to the value of the distance b4 or smaller.

For example, the distances c1 to c3 are set in the range of 0.2 μm to 1.0 μm, and the distances c4 to c9 are larger than the distances b1 to b3 by the range of 0.1 μm to 0.6 μm.

For example, the distances d1 to d3 are set in the range of 0.6 μm to 1.6 μm, and the distances d4 to d9 are larger than the distances d1 to d3 by the range of 0.1 μm to 0.6 μm.

Next the gate length g will be described. The gate lengths g are equalized to one another in the MOS transistors TR2 to TR9, and the gate lengths g of the MOS transistors TR2 to TR9 are set smaller than the gate length g of the MOS transistor TR1. That is, g2=g3=g4=g5=g6=g7=g8=g9<g1.

The gate lengths g2 to g9 are set in the range of 1.5 μm to 3.5 μm. For example, the gate lengths g2 to g9 are set to 2.4 μm. The gate lengths g1 is larger than the gate lengths g2 to g9 by the range of 0.4 μm to 1.0 μm. For example, the gate lengths g1 is set to 3.0 μm.

<<Operation of Charge Pump Circuit>>

Figure 12:
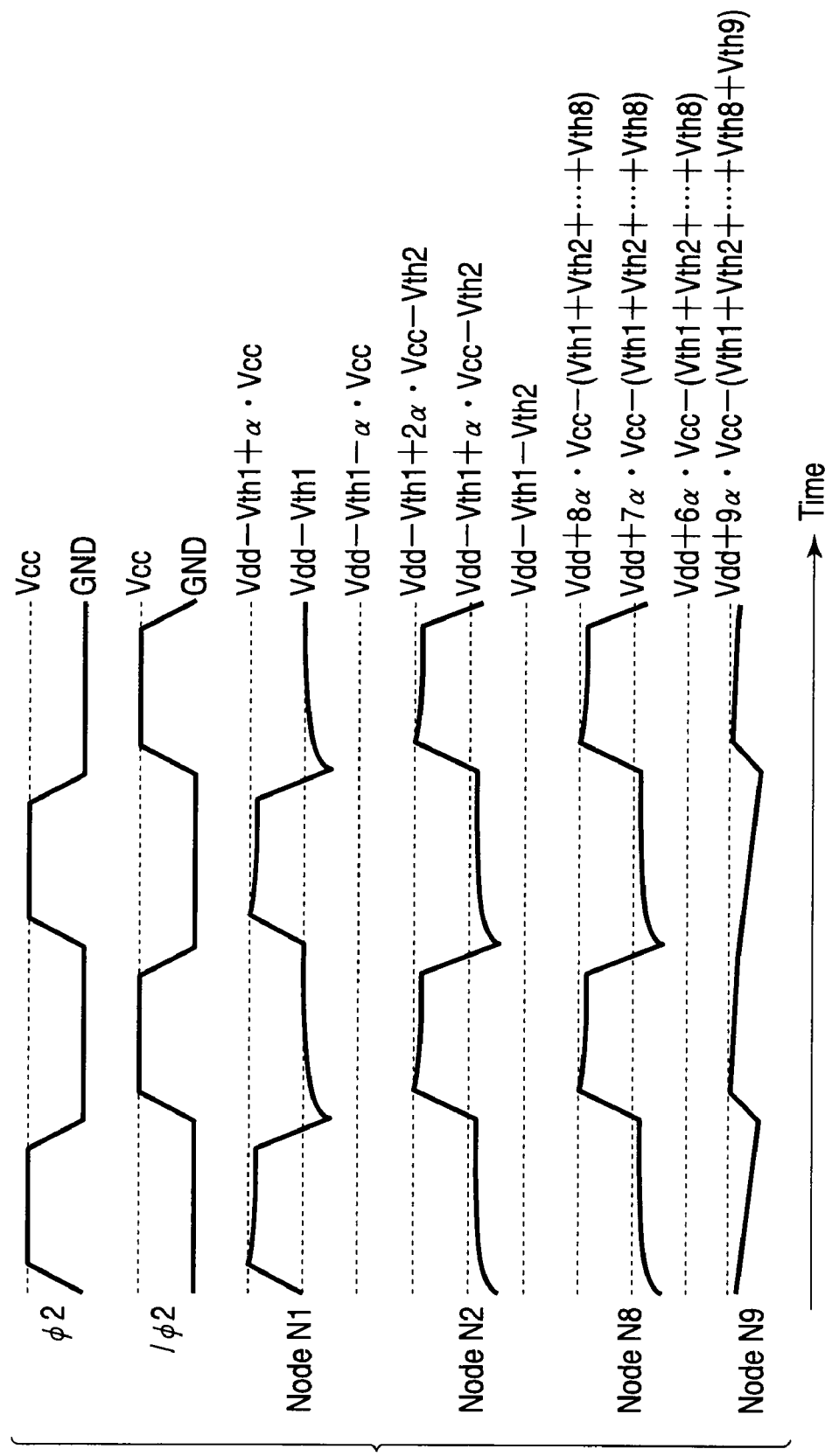
FIGS. 12 and 13 are timing charts showing a voltage at each node of the charge pump circuit according to the first embodiment.

An operation of the charge pump circuit 6 having the above-described configuration will be described below with reference to FIG. 12. FIG. 12 is a timing chart showing the clock φ2 and/φ2 and a change in potential at each of the nodes N1, N2, N8, and N9 in the charge pump circuit of FIG. 3.

As shown in FIG. 12, both the clock signals φ2 and/φ2 can take a voltage Vcc in "High" level and GND in "Low" level, and the clock signals φ2 and/φ2 are a so-called two-phase clock in which the voltage Vcc is output such that output timings are not overlapped with each other. This is because a time for cutting off the conduction state between the MOS transistors TR adjacent to each other is provided in the series-connected MOS transistors TR1 to TR9. This enables the charges to be prevented from flowing back from the node N9 toward the node N1. A voltage of 3V to 10V is used as the voltage Vcc, whereby a high voltage of 10V or higher is obtained as the output voltage Vout. The output voltage Vout is used as voltages VPGM and VPSS. In FIG. 4, Vth1, Vth2, . . . , and Vthi (i is an integer of 1 to 9) are threshold voltages of the MOS transistor TRi. The power supply voltage Vdd ranges from 1V to 4V, and desirably the power supply voltage Vdd is matched with the power supply voltage of the NAND-type flash memory 1. This is because the matching of the power supply voltage Vdd and the power supply voltage of the NAND-type flash memory 1 can reduce the power supply impedance to prevent a fluctuation in output voltage.

The operation of the charge pump circuit 6 will be described below with reference to FIG. 12. In the case where the clock signal φ2 has the potential of GND and the MOS transistor TR2 is in the non-conduction state, the MOS transistor TR1 is in the conduction state, and the node N1 is charged to a voltage which is lowered from Vdd by a threshold voltage Vth1 of the threshold voltage Vthi, that is, (Vdd−Vth1).

When the clock signal φ2 continuously rises to Vcc, the potential at the node N1 is increased by αVcc due to capacitive coupling of the capacitor element C1.

As a result, the potential at the node N1 is increased up to (Vdd−Vth1+αVcc). The voltage amplitude at the node N1 is decreased to αVcc by a charge sharing of the capacitor element C1 and the MOS transistors TR1 and TR2. α is a value corresponding to a bootstrap ratio, α is slightly smaller than 1, and α usually ranges from 0.7 to 1.

The MOS transistor TR2 turns into the conduction state while the clock signal φ2 has the voltage Vcc. Therefore, the voltage at the node N1 is transferred to the node N2 until the potential at the node N2 is increased to {(potential at the node N1)−Vth2)}, and the potential at the node N2 substantially rises to {(Vdd−Vth1+αVcc)−Vth2}.

Then clock signal φ2 becomes 0V and the MOS transistor TR2 turns into the non-conduction state. The clock signal φ2 rises from GND (0V) to Vcc, whereby the potential at the node N2 is increased by αVcc due to the capacitive coupling of the capacitor element C2. As a result, the potential at the node N2 substantially rises to {(Vdd−Vth1+αVcc)−Vth2}+αVcc. In the first embodiment, because a forward current driving performance per unit width of the MOS transistor TR2 can be improved, a high boosting performance can be realized with the MOS transistor having smaller dimensions (occupied area). The same holds true for the MOS transistor TR3. This point is described in detail later.

Then the MOS transistor TR3 becomes the conduction state while the clock signal /φ2 has the voltage Vcc. Therefore, the voltage at the node N2 is transferred to the node N3 until the potential at the node N3 is increased to {(potential at the node N2)−Vth3}.

The charge transfer is mutually repeated to perform the boosting to the node N9. While the signal /φ2 has the voltage Vcc, the MOS transistors TR1, TR3, TR5, TR7, and TR9 are in the conduction state, and the MOS transistors TR2, TR4, TR6, and TR8 are in the non-conduction state. Therefore, the currents are passed from the Vdd node to the node N1, from the node N2 to the node N3, from the node N4 to the node N5, from the node N6 to the node N7, from the node N8 to the node N9 to transfer the charges. While the signal φ2 has the voltage Vcc, the MOS transistors TR2, TR4, TR6, and TR8 are in the conduction state, and the MOS transistors TR1, TR3, TR5, TR7, and TR9 are in the non-conduction state. Therefore, the currents are passed from the node N1 to the node N2, from the node N3 to the node N4, from the node N5 to the node N6, from the node N7 to the node N8 to transfer the charges. At this point, in the MOS transistors TR4 to TR9, a threshold voltage increase is small when the back bias is applied, and the forward current driving performance per unit width of the transistor is enhanced. Therefore, a higher boosting performance can be realized, and such high boosting performance can be realized with a MOS transistor having smaller dimensions (occupied area). Particularly, in the MOS transistor TR9, the junction breakdown voltage and the surface breakdown voltage are enhanced, therefore the boosting can be performed to a higher voltage. This point is also described in detail later. In the case where a capacitive load such as the word line is electrically connected to the node N9, the output voltage is smoothed by the capacitive load as shown in FIG. 12.

Figure 13:
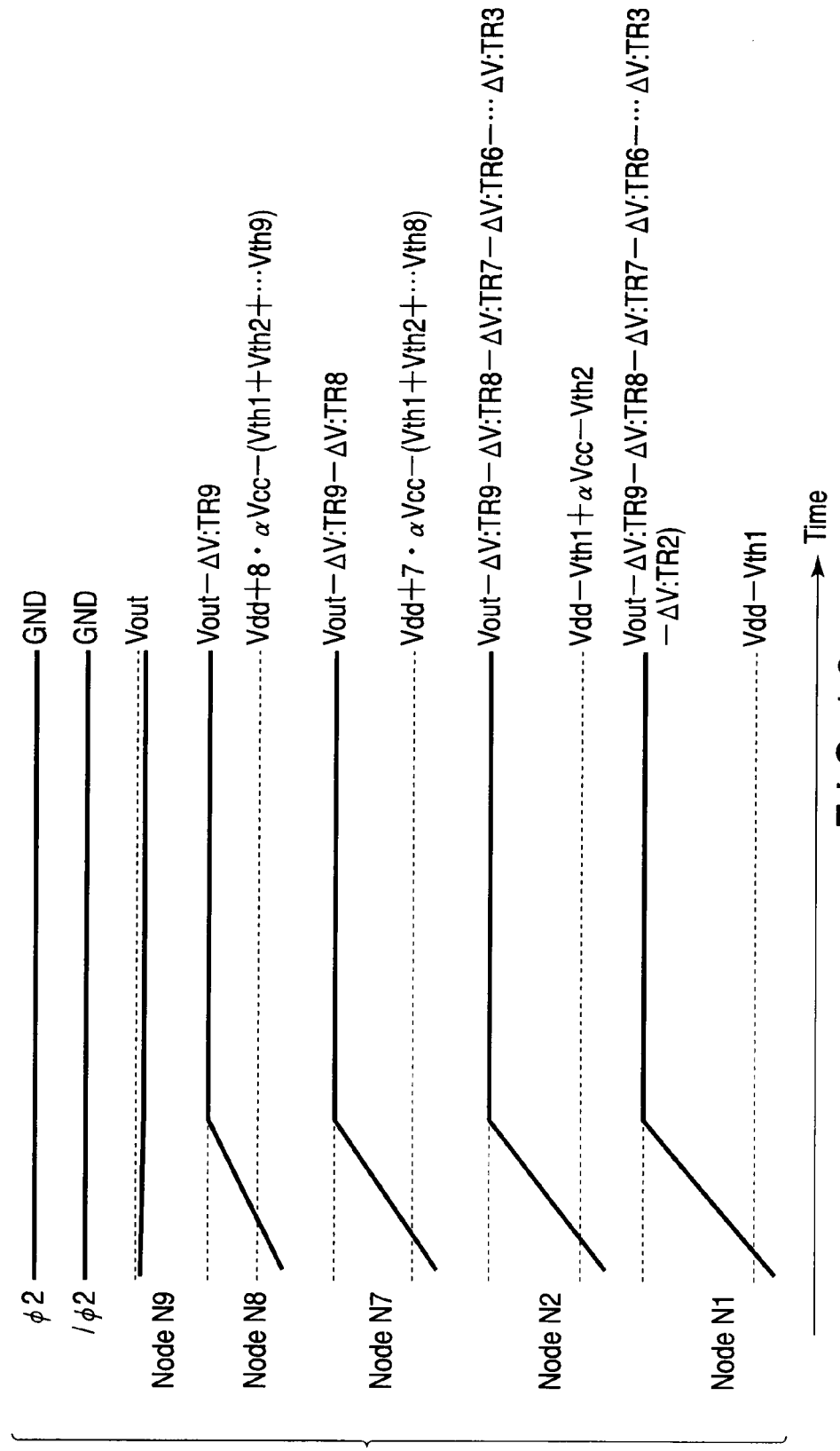

FIG. 13 shows the state in which the clocks φ2 and /φ2 are stopped in the charge pump circuit 6 of FIG. 3 after the output voltage Vout is boosted to {Vdd+8α·Vcc−(Vth1+Vth2+Vth3+Vth4+Vth5+Vth6+Vth7+Vth8+Vth9))}, and FIG. 13 is a timing chart showing the clocks φ2 and /φ2 and the potential at each of the nodes N1, N2, N8, and N9 in the charge pump circuit 6 of FIG. 3.

In the case where the power supply is suddenly cut off after a large capacitive load such as the p-type well region 12 is boosted, an extremely large voltage is sometimes applied to the semiconductor element included in the charge pump circuit 6. It is therefore necessary that the charge pump circuit 6 be designed such that the semiconductor element is not degraded and the large leakage current is not generated even in the case.

In the first embodiment, the current passed between the node N9 and the node N8 until the MOS transistor TR9 is turned off, that is, the current is stopped when the potential at the node N8 is not lower than (Vout−ΔV: TR9). As used herein, ΔV shall mean a voltage corresponding to ΔV in the case where the voltage between the source electrode and the gate electrode is set at (Vout−ΔV) in passing a current Ith which is a threshold current between the source electrode and the drain electrode of the MOS transistor TR9, when the voltage Vout is lowered at the state in which the voltage of 0V is applied to the semiconductor substrate 10, the voltage Vout is applied to the drain electrode and the voltages at the source electrode and gate electrode are equalized. It is assumed that the threshold current Ith is set at (40 nA×(W/L)) when a transistor has a gate length L and channel width W.

Similarly, in the MOS transistors TR2 to TR8 preceding the MOS transistor TR9, the current is passed to lower the potentials at the nodes N1 to N7 until each transistor is turned off. In such cases, the voltage at the node N9 is transferred in the direction of the node N1 and lowered by the threshold voltages of the MOS transistors. Therefore, for example, the potential of the node N7 becomes (Vout−ΔV:TR9)−ΔV:TR8, and the potential of the node N6 becomes (Vout−ΔV:TR9) −ΔV:TR8−ΔV:TR7. As used herein, ΔV:TR8 shall mean an amount of voltage drop of the node N7 with respect to the node N8, and the amount of voltage drop satisfies a condition that the current is stopped in the MOS transistor TR8 as shown in FIG. 13. The amount of voltage drop of the node N(i−1) with respect to the node Ni satisfying the condition that the current is stopped in the MOS transistor TRi is referred to as (ΔV:TRi). Accordingly, compared with the MOS transistor connected to the node N9, a low-voltage transistor can be used as the MOS transistors connected to the nodes N1 and N2.

<Sectional Relationship and Operations of Memory Cell Array and Charge Pump Circuit>

A sectional relationship between the memory cell array 2 and the charge pump circuit 6 and operations of the memory cell array 2 and the charge pump circuit 6 will be described below with reference to FIG. 14. FIG. 14 is a sectional view showing the NAND-type flash memory 1, and particularly FIG. 14 shows a region including a part of the region of the memory cell array 2 and a part of the region of the charge pump circuit 6.

FIG. 14 also shows a MOS transistor Q1 having a withstand voltage higher than that of the memory cell transistor MT in addition to the memory cell array 2 and the charge pump circuit 6. The MOS transistor Q1 is included in a circuit block except for the memory cell array 2, for example, included in the row decoder 3 and voltage generating circuit 4. FIG. 14 shows a section in the gate length direction for all the MOS transistors and capacitor elements C. However, it is not always necessary that elements be disposed so as to obtain the sections of FIG. 14. In FIG. 14, a MOS transistor Q2 corresponds to the memory cell transistor MT or the selection transistor ST, and a MOS transistor Q3 corresponds to the MOS transistors TR1 to TR9.

In an EEPROM such as a flash memory, it is necessary to provide a high-voltage generating circuit (voltage generating circuit 4 in FIG. 1) which generates a high voltage from a low voltage. The high-voltage generating circuit generates a voltage difference of 10V to 15V or higher with respect to the semiconductor substrate 10. Therefore, the high-voltage generating circuit includes a boosting circuit. A charge pump circuit (charge pump circuit 6 in FIG. 1) can be cited as an example of the boosting circuit.

The charge pump circuit includes plural capacitors (capacitor elements C1 to C9 in FIG. 3), in which the charges are accumulated, and plural transistors (MOS transistors TR1 to TR9 in FIG. 3) which control the charge accumulation. In the first embodiment, MOS transistor Q1 is shown in FIG. 14 as an example of a transistor. The MOS transistor Q1 is a high-voltage transistor. The high-voltage transistor includes the gate insulation film 42 having a film thickness larger than that of the memory cell transistor Q2 so as to withstand the voltage of 15V or higher with respect to the potential at the substrate 1.

Each of the capacitors C is formed on the element region AA provided in the semiconductor substrate 10. Each of the element regions AA is surrounded by the element isolation region STI, and the element regions AA are electrically separated from each other. Similarly to the MOS transistor Q3, the capacitor C includes the gate insulation film 42, the gate electrode 34, and the n-type impurity diffusion layers 31 and 32. The gate electrode 34 is formed on an n-type well region 51 formed in the surface of the semiconductor substrate 10 (element region AA). Similarly to the gate electrode 34 of the MOS transistor TR, the gate electrode 34 of the capacitor C includes the first conductive layer 43 formed on the gate insulation film 42, the block insulation film 44 formed on the conductive layer 43, and the second conductive layer 45 formed on the block insulation film 44. The diffusion layers 31 and 32 are also formed in the well region 51. The well region 51 and the diffusion layers 31 and 32 function as one of the electrodes of the capacitor C, the conductive layers 43 and 45 function as the other electrode, and the gate insulation film 42 functions as the capacitor insulation film. The gate insulation film 42 of the capacitor C has a film thickness larger than that of the memory cell transistor Q2 so as to withstand the voltage of 15V or higher with respect to the potential at the well region 51. The same gate insulation film is used by the capacitor C and the MOS transistor Q3, which allows the charge pump circuit 6 to be realized without increasing the number of production processes.

In the flash memory, during the data erase or data write, usually a positive voltage of 15V or higher is applied to the well region 12 or the control gate 18. From this standpoint, it is necessary that the high-voltage transistor including the gate insulation film having a large film thickness be used as the transistor Q3. The gate insulation film 42 of the MOS transistor Q3 may have a film thickness of 16 nm to 50 nm, and the gate insulation film 42 is made of a material such as silicon oxide film and the oxynitride film. The voltage of 15V or higher is applied between the drain of the high-voltage transistor Q3 and the semiconductor substrate 10. Therefore, a channel region having an impurity concentration of $10^{14}$ cm$^{-3}$ to $5 \times 10^{16}$ cm$^{-3}$ is required to avoid the junction breakdown in a region from a surface to a depth of 1 μm.

In the first embodiment, the p-type semiconductor substrate 10 is used as the channel region.

As shown in FIG. 14, the p-type well region 12 is formed in the surface region of the semiconductor substrate 10. An n-type well region 50 is formed in the side surface of the well region 12 so as to contact the well region 12, and the n-type well region 11 is formed in the lower region of the well region so as to contact the well regions 12 and 50. Therefore, the p-type well region 12 is surrounded by the n-type well regions 11 and 50, and the well region 12 is electrically separated from the semiconductor substrate 10. The well region 12 is electrically separated from the semiconductor substrate 10, so that the voltage at the well region 12 can be changed independently of the semiconductor substrate 10 according to the operation. The use of the above-described double well structure can reduce the load on the charge pump circuit 6 to lower power consumption.

The MOS transistor Q2 functioning as the memory cell transistor MT is formed on the well region 12. The memory cell transistors MT are separated in the word line direction by the element isolation region STI. The element isolation region STI has a depth of about 0.1 µm to about 0.5 µm. As described above, the element isolation region STI is formed by burying an insulating material such as silicon oxide film in the trench having a depth of about 0.1 µm to about 0.5 µm made in the semiconductor substrate 10.

In order to realize an uniformity of the data erase quality in the plural memory cell transistors Q2, it is necessary to equalize the potential in the well region 12. Therefore, the well region 12, that is, the boundary between the well region 12 and the well region 11, has a sufficient depth compared with the bottom surface of the element isolation region STI. The well region 12 has a depth of 0.4 µm or more to 0.9 µm or less from the surface of the semiconductor substrate 10. For example, the well region 12 has a depth of 0.5 µm. For example, boron is doped in the well region 12, and the impurity concentration of the well region 12 is set in the range of $10^{14}$ cm$^{-3}$ to $10^{19}$ cm$^{-3}$. The well region 11, that is, the boundary between the well region 11 and the semiconductor substrate 10, has a depth of 1.2 µm to 4 µm from the surface of the semiconductor substrate 10.

The stacked gate of the memory cell transistor Q2 has a gate length (width of the stacked gate in the direction in which the source, the channel, and the drain are sequentially disposed) of 0.01 µm or larger to 0.5 µm or smaller.

In the NAND-type EEPROM, the tunnel current through the tunnel insulation film 13 is utilized for the data erase, that is, the charge injection into the floating gate 14 or the charge emission from the floating gate 14. In the NOR-type flash memory, sometimes the tunnel current is utilized during the data erase in order to be less affected by the short channel effect.

The data erase is simultaneously performed on plural memory cell transistors in order to increase the number of memory cells erased per unit time. That is, the memory cell transistor enables collective data erase. Therefore, during the data erase, a positive voltage of 15V or higher is applied to the well region 12 with respect to the semiconductor substrate 10, which extracts the charges from the floating gate 14 to the well region 12.

On the other hand, during the data read and data write, the well region 12 is kept at the voltage of 0V to lower the voltage applied to the diffusion layer 17. Therefore, the electric power for charging and discharging the well region 12 can be reduced to enhance an operation speed. In the NAND-type flash memory according to the first embodiment, the node N9 of the charge pump circuit 6 is selectively connected to the well region 12 or control gate 16 (word line WL) of the memory cell transistor Q2 to perform the data erase and the data write.

It is assumed that each of the MOS transistors of FIG. 14 is formed on the p-type semiconductor substrate 10 having the same impurity concentration and the well regions are electrically connected to the well terminals, respectively. Therefore, the number of types of the transistors can be decreased, the increase of the number of processes for changing the channel concentration of each transistor can be prevented, and a well resistance to each transistor can be decreased.

The MOS transistor Q1 is a high-voltage transistor having the structure similar to that of the MOS transistor Q3. The MOS transistors Q1 and Q3 have the substantially same structure as the memory cell transistor Q3 except for the allowable voltage range. The MOS transistors Q1 and Q3 differ from the memory cell transistor Q3 in that the first conductive film 43 and the second conductive film 45 are connected through an opening formed in the block insulation film 12. Therefore, the first and second conductive films 43 and 45 can be used as one gate electrode while the MOS transistors Q1 and Q3 have a stacked gate structure similar to that of the memory cell transistor Q3. The same holds true for the capacitor C which is used as the capacitor element of the charge pump circuit 6.

The element isolation regions STI are formed in the boundary portions of the regions where the memory cell array 2, the MOS transistor Q1, the MOS transistor Q3, and the capacitor C are formed. The p-type well region 36 having the same conductive type as the semiconductor substrate 10 is formed immediately below the element isolation region STI. A part of the well region 36 is formed so as to reach the surface of the semiconductor substrate 10 (nMOS forming region in FIG. 14). The nMOS forming region is used as an n-channel MOS transistor forming region. Obviously, as described above, the well region 36 has the function of preventing punch-through. The distance d from the well region 36 to the boundary between the element isolation region STI and the element region AA is decreased to reduce an element area. However, the junction breakdown voltages of the source and drain are deteriorated.

The p-type region 37 is formed in order to prevent a punch-through leakage current in the bottom portion of the element isolation region STI. The distance c from the p-type region 37 to the boundary between the element isolation region STI and the element region AA is decreased to reduce the element area. However, the junction breakdown voltages of the source and drain are deteriorated.

<Effect>

Thus, in the NAND-type flash memory according to the first embodiment of the invention, the boosting efficiency can be enhanced while the increase in circuit area is prevented. The effect according to the first embodiment will be described below compared with the conventional configuration.

<<Conventional Configuration>>

Conventionally, a configuration in which a rectifying element and a pn-junction diode are used is known as the configuration of the charge pump circuit in which the rectifying element and the capacitor element are used. However, the following problems are generated when the pn-junction diode is used.

For example, in the case where an ordinary two-terminal diode is formed on the p-type semiconductor substrate through a MOS process, an n-type well region is formed in the semiconductor substrate, and a p$^+$-type region having an acceptor concentration higher than that of the n-type well region is formed in the n-type well region, thereby electrically separating the semiconductor substrate and the diode. In the case of the MOS process, it is necessary that the n-type well region be formed by lithography having a loose design rule. Accordingly, the element size is inevitably enlarged. For example, the n-type well region, which can be realized by lithography with a loose design rule, has a width of about 0.6 µm to about 5 µm, and a facing area between the n-type well region and the P-type semiconductor substrate is enlarged, which results in a problem in that the junction leakage current is increased.

In the case where a forward bias is applied to the pn-junction in the diode formed by the $p^+$-type region and the n-type well region, conduction electrons flow into the p-type region through the pn-junction, and holes flow into the n-type region, and minority carriers are accumulated. Then, in the case where a reverse bias is applied subsequently to the pn-junction, a switching time of the diode is delayed by the time the minority carriers accumulated near the pn-junction are completely extracted, which is a so-called reverse recovery time. For example, the delay time ranges from 50 ns to 500 ns. Therefore, high-speed switching of the diode is hardly performed, which results in a problem in that a frequency upper limit of the charge transfer is restricted by an inverse number of the switching time.

Considering the above-described problems, the MOS transistor is frequently used as the rectifying element of the charge pump circuit. That is, the drain and gate of the MOS transistor are connected, a drain current is passed through the source when the drain voltage is higher than the threshold voltage, and the drain current is not passed through the source when the drain voltage is lower than the threshold voltage, which allows the rectifying element to be realized. At this point, the switching time of the rectifying element mainly depends on a transit time of the majority carriers between the source and the drain and time constants of the gate capacitance and gate resistance. Therefore, high-speed switching can be performed compared with the pn-junction diode, and the switching time ranges from about 40 ns to about 100 ns. Accordingly, the frequency upper limit of the charge transfer can be improved to the charge and discharge time defined by the capacitor element and the resistance of the transistor. In the case of the rectifying element in which the MOS transistor is used, the threshold voltage is set higher than the voltage of 0V when the back bias voltage of −Vdd to −Vout is applied, which allows a rectifying element to be realized. As a result, in the case where the back bias is applied, the threshold voltage is set at a voltage lower than a built-in voltage of the pn-junction, for example, 0.6V, so that a charge pump circuit having a high boosting efficiency can be realized.

However, even in the charge pump circuit in which the MOS transistor is used as the rectifying element, the following problems are generated. Similarly to the configuration according to the first embodiment of FIG. 3, it is assumed that k (k is a natural number) MOS transistors TRi (i=1 to k) functioning as the rectifying elements are series-connected.

In the MOS transistor TRi, a voltage higher than that of the MOS transistor TR(i−1) is applied to the source and the drain by the boosting operation. Accordingly, in the case where the MOS transistors TRi are formed on the common p-type semiconductor substrate, an acceptor charge amount is increased in a channel depletion layer of the MOS transistor TR, leading to increasing the threshold voltage. This is a so-called back bias effect. Due to the back bias effect, the threshold voltage Vthi of the MOS transistor TRi which is operated in the conduction state is higher than the threshold voltage Vth(i−1) of the MOS transistor TR(i−1) which is operated in the conduction state.

The maximum voltage at the node Ni is higher than the maximum voltage at the node N(i−1) by (αVcc−Vthi). That is, as i is increased, the voltage which can be boosted per one stage is lowered by the increase in Vthi. Accordingly, in the final-stage MOS transistor TRk (i=k), the boosting efficiency is deteriorated most significantly.

In order to generate a high voltage, it is necessary to increase the number of stages of the MOS transistor TR and capacitor element, which results in a problem of the deterioration of the boosting performance and enlargement of the circuit area. A series resistance of the source and drain is increased in the structure in which the MOS transistors TR2 to TRk have the same dimensions or in the MOS transistor TR1 near the first stage, which results in a problem in that a sufficient current driving performance cannot be secured. Additionally, it is necessary to maintain a high breakdown voltage in the final-stage MOS transistor TRk. However, in the case where the MOS transistors TR2 to TRk have the same dimensions, a balance is hardly established between the high-voltage output and the high current driving performance.

Thus, the following problems are generated in the charge pump circuit in which the MOS transistors functioning as the rectifying elements are series-connected:

(A) The threshold voltage is increased by the back bias effect as the MOS transistor is located in a later stage. Accordingly, in order to generate a high voltage, it is necessary to increase the number of stages of the MOS transistor and capacitor element, which lowers the boosting performance and enlarges the circuit area.

(B) When the first-stage or second-stage MOS transistor and the final-stage MOS transistor have the same dimensions, the series resistance of the source and drain is increased. Therefore, a sufficient current driving performance is hardly secured.

Figure 15:
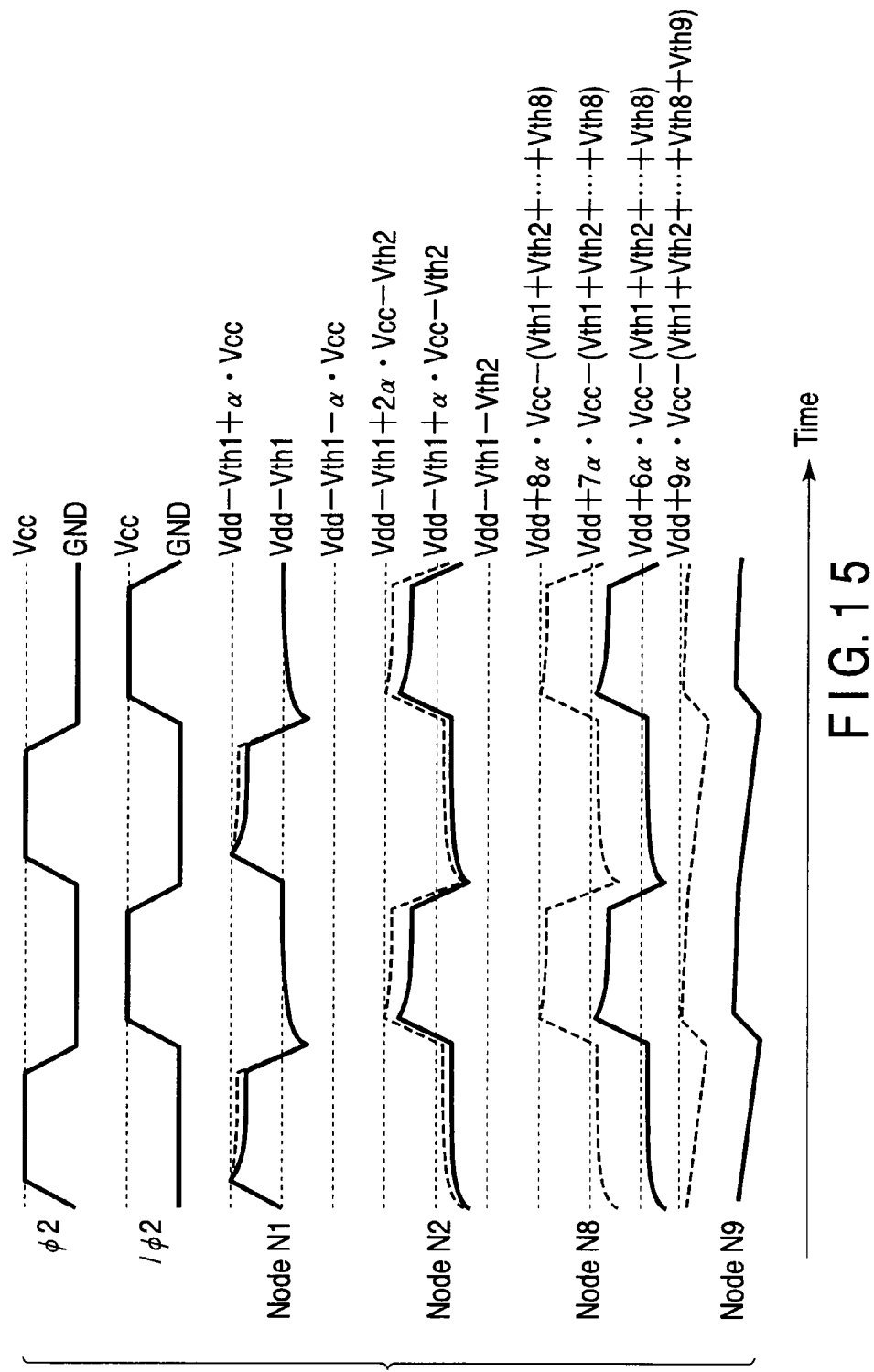
FIG. 15 is a timing chart showing a voltage at each node of the charge pump circuit.

(C) It is difficult to maintain both of the high current driving performance and the high breakdown voltage in the later-stage MOS transistor As an example, FIG. 15 is a timing chart showing the clocks φ2 and /φ2 and the voltages at the nodes N1, N2, N8, and N9 when the distances a to d and the gate lengths g of the MOS transistors TR1 to TR9 are set identical in the charge pump circuit of FIG. 3. FIG. 15 shows the case in which the distances b to d and the gate length g are set to the same values as the MOS transistor TR2 according to the first embodiment and the distance a is set to the same value as the MOS transistor TR4. In FIG. 15, a broken line indicates a waveform of the charge pump circuit according to the first embodiment. As can be seen from FIG. 15, the output voltage of the later-stage MOS transistor TR is lowered, and the output voltage of the final-stage MOS transistor TR9 (node 9) is largely decreased compared with the configuration according to the first embodiment.

Configuration of First Embodiment

The configuration according to the first embodiment can solve such problems. The effect according to the first embodiment will be described below with reference to FIGS. 16 to 32. FIGS. 16 to 32 are graphs showing a static characteristic according to layout dimensions of the MOS transistor TR, and the graphs of FIGS. 16 to 32 become pieces of data with which the change in forward current per unit width can quantitatively be discussed. In FIG. 16 to FIG. 32, a mark "x" indicates an actual value, marks "○", "Δ", and "□" indicate a median, and a solid line in the graph connects the medians. In the following description, "surface breakdown voltage" shall mean a junction breakdown voltage in the case where the drain voltage is increased while the gate voltage of the MOS transistor TR and the voltage at the semiconductor substrate 10 are set to 0V. In such cases, the surface breakdown voltage is deteriorated because the semiconductor channel surface becomes a potential close to the accumulation state due to the voltage at the gate electrode 34 rather than the usual junction breakdown voltage.

Figure 16:
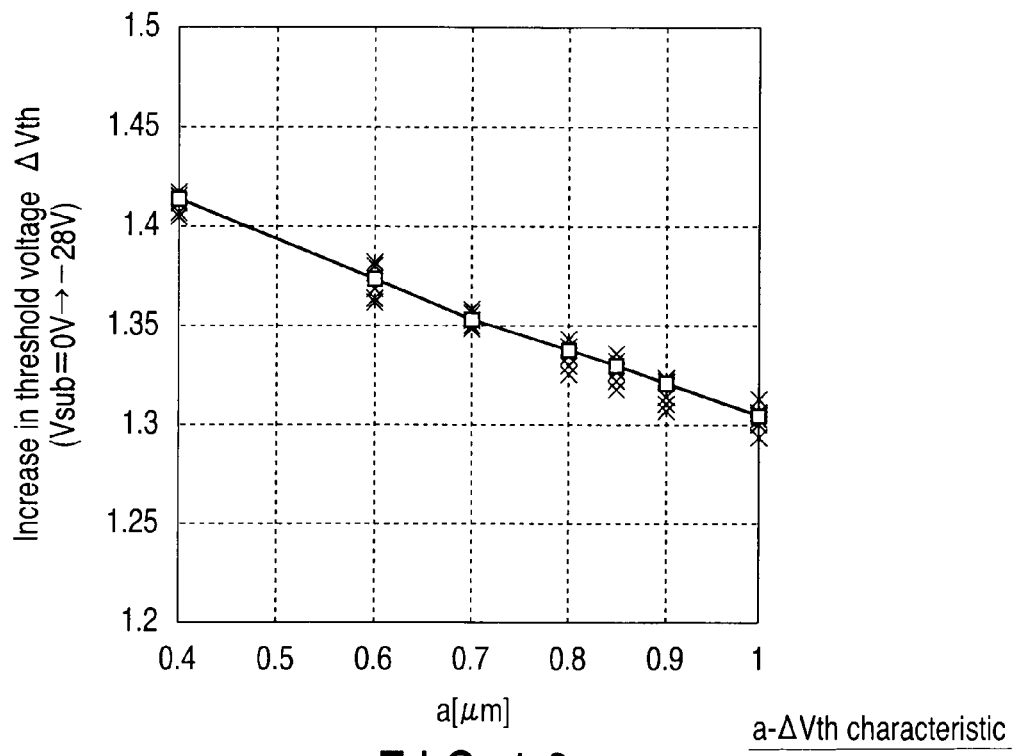
FIG. 16 is a graph showing a relationship between the distance a and an increase in threshold voltage.
Figure 17:
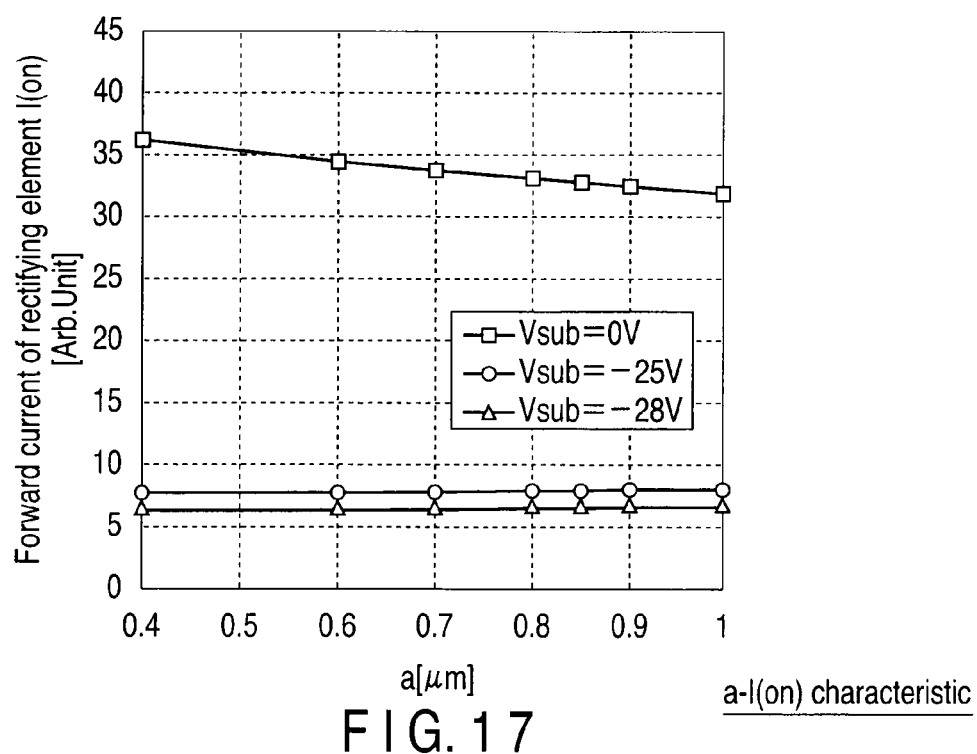
FIGS. 17 and 18 are graphs showing a relationship between the distance a and a forward current.
Figure 18:
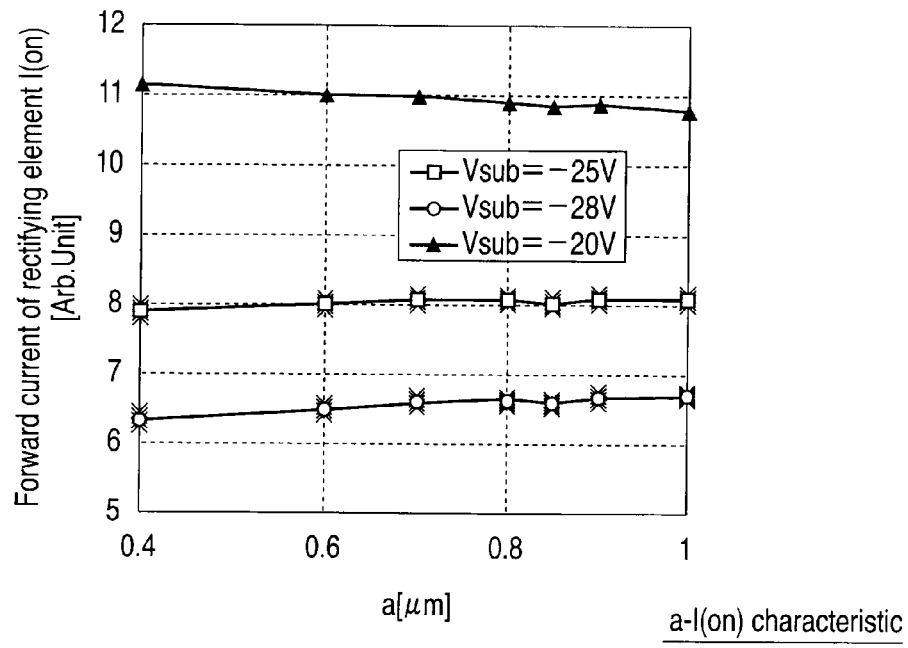
Figure 19:
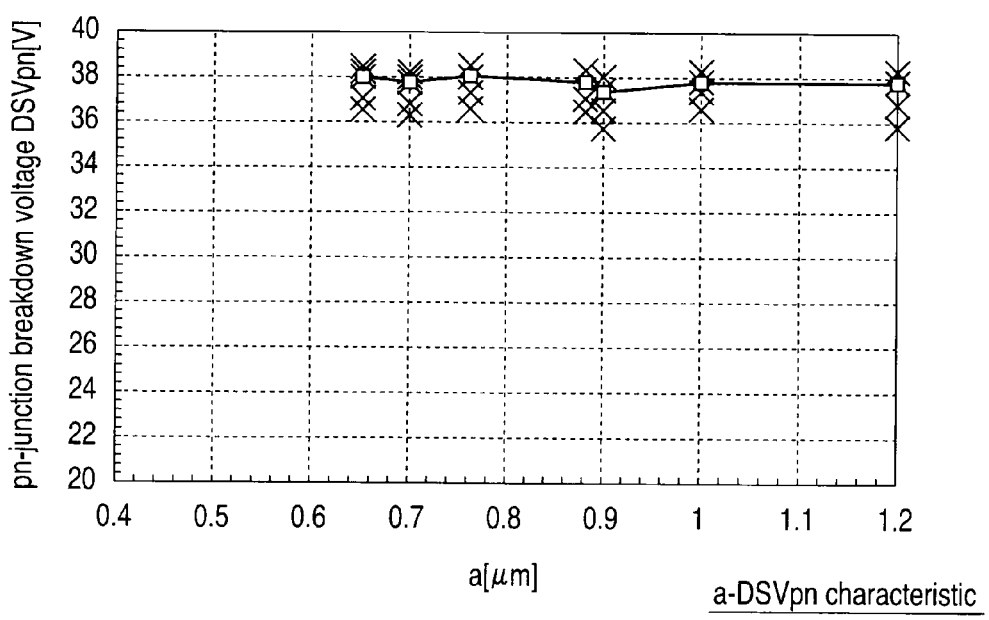
FIG. 19 is a graph showing a relationship between the distance a and a pn-junction breakdown voltage.

FIGS. 16 to 20 are graphs showing various characteristics when the distance a is changed. FIG. 16 shows an increase ΔVth in threshold voltage of the MOS transistor TR when a voltage Vsub at the semiconductor substrate 10 is changed from 0V to −28V. FIGS. 17 and 18 show a forward current I(on) of the MOS transistor TR when a voltage higher than the source by 2.4V is applied to the drain and gate. FIGS. 19 and 20 show a pn-junction breakdown voltage DSVpn and a surface breakdown voltage DSVsurf. The a-I(on) characteristic is shown at the voltages Vsub 0V, −20V, −25V, and −28V.

FIGS. 21 and 22 are graphs showing various characteristics when the distance b is changed. FIGS. 21 and 22 show the pn-junction breakdown voltage DSVpn and the surface breakdown voltage DSVsurf, respectively.

Figure 24:
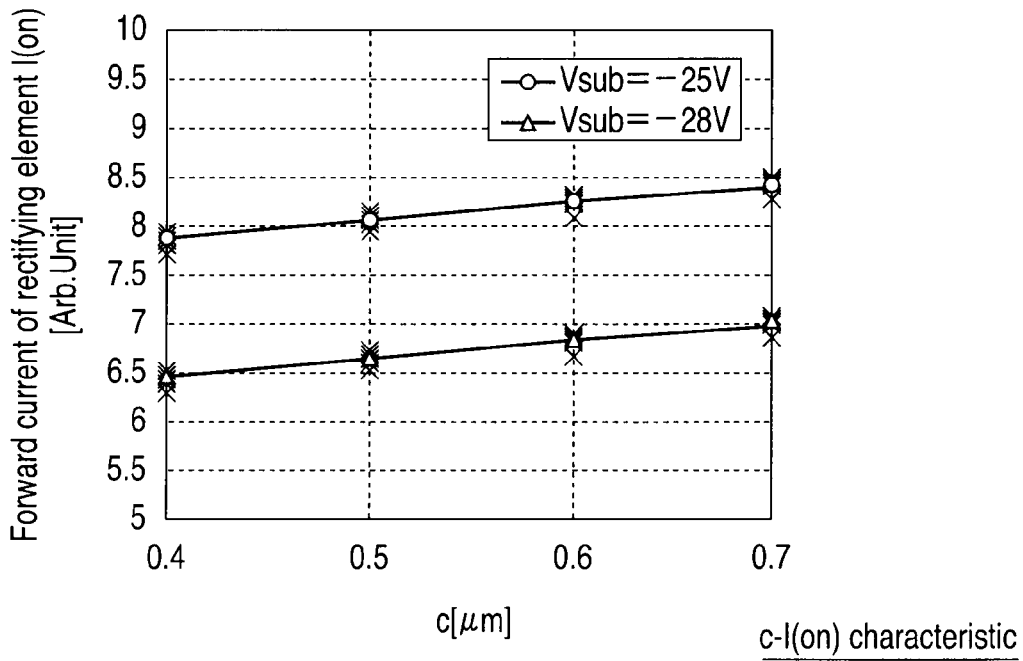
FIGS. 24 and 25 are graphs showing a relationship between the distance c and the forward current.
Figure 25:
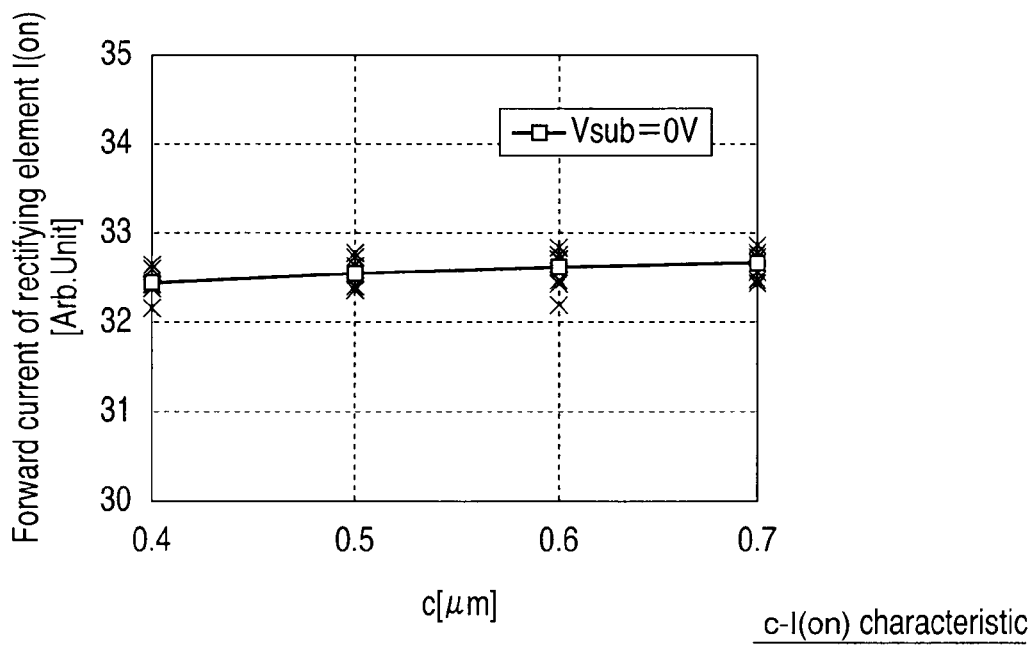
Figure 26:
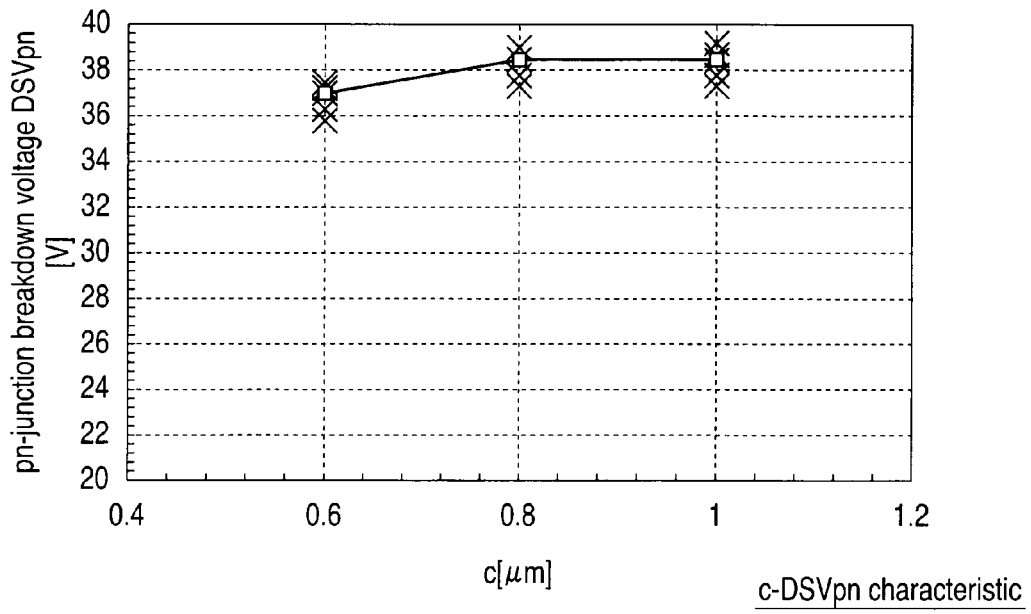
FIG. 26 is a graph showing a relationship between the distance c and the pn-junction breakdown voltage.
Figure 27:
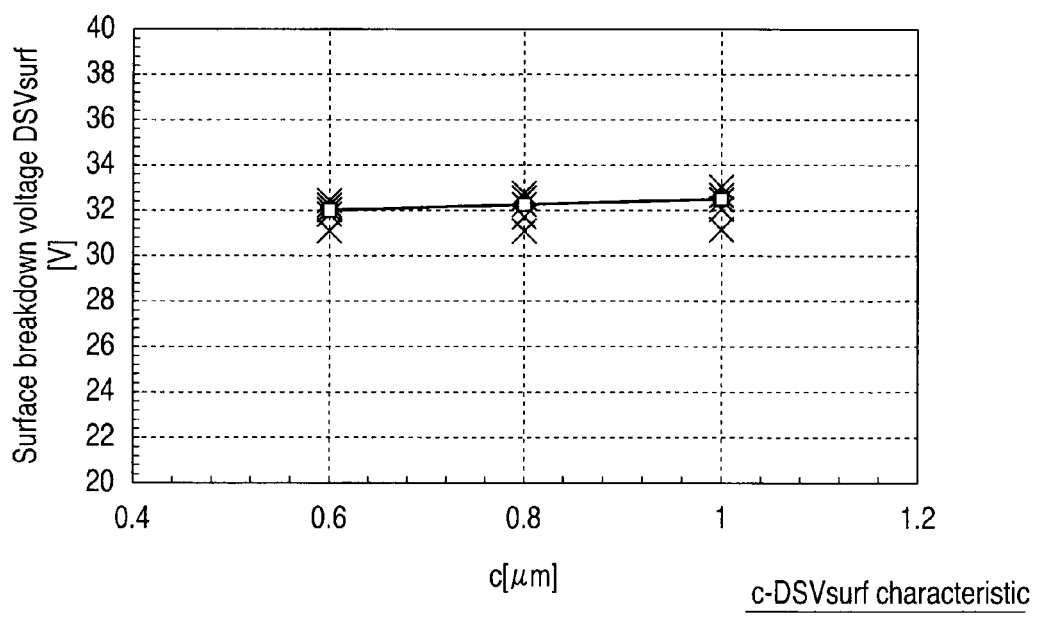
FIG. 27 is a graph showing a relationship between the distance c and the surface breakdown voltage.

FIGS. 23 to 27 are graphs showing various characteristics when the distance c is changed. FIG. 23 shows the increase ΔVth in threshold voltage, FIGS. 24 and 25 show the forward current I(on), and FIGS. 26 and 27 shows the pn-junction breakdown voltage DSVpn and the surface breakdown voltage DSVsurf, respectively. The c-I(on) characteristic is shown at the voltages Vsub 0V, −25V, and −28V.

Figure 32:
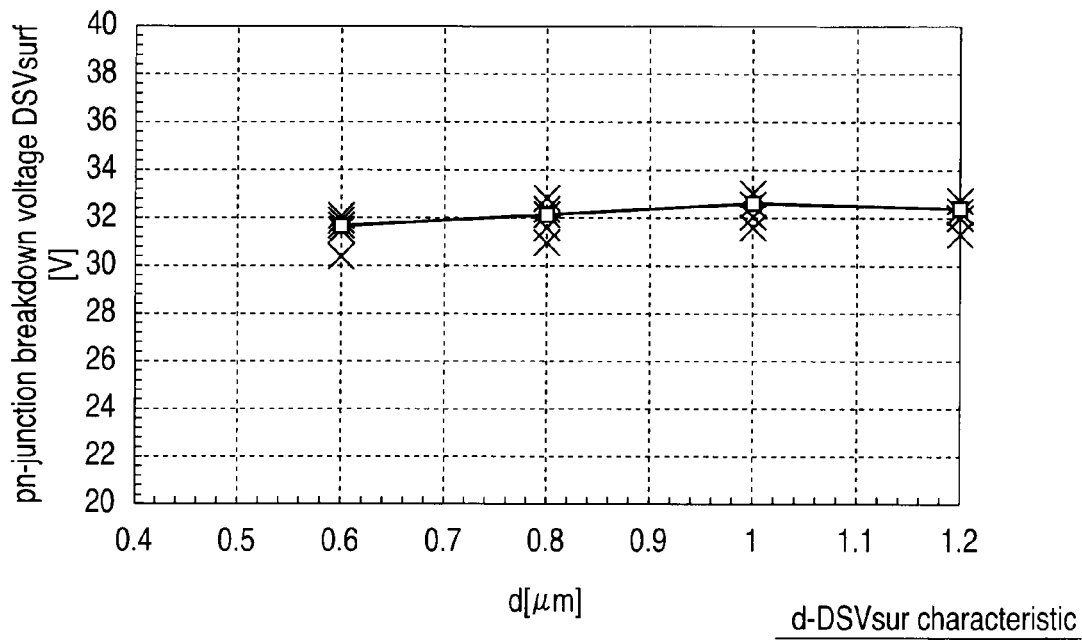
FIG. 32 is a graph showing a relationship between the distance d and the surface junction breakdown voltage.

FIGS. 28 to 32 are graphs showing various characteristics when the distance d is changed. FIG. 28 shows the increase ΔVth in threshold voltage, FIGS. 29 and 30 show the forward current I(on), and FIGS. 31 and 32 show the pn-junction breakdown voltage DSVpn and the surface junction breakdown voltage DSVsurf, respectively. The d-I(on) characteristic is shown at the voltages Vsub 0V, −25V, and −28V.

(1) MOS Transistors TR2 and TR3

The distances a2 and a3 of the MOS transistors TR2 and TR3 according to the first embodiment is smaller than the distances a4 to a8 of the MOS transistors TR4 to TR8. More specifically, the distances a4 to a7 are kept constant in the range of 0.5 μm to 1.2 μm, and the distances a2 and a3 are smaller than the distances a4 to a7 by a range of 0.1 μm to 0.4 μm. As shown in FIGS. 17 and 18, when the back bias (Vsub) ranges from 0V to 20V, the forward currents of the MOS transistors TR2 and TR3 having smaller distances a can be increased compared with the later-stage MOS transistors TR4 to TR9, which have larger distances a. As described later, the inventor has found that dependence of the forward current I(on) on the distance a is reversed with a back bias of −20 to −25V.

When the distance a is decreased, the breakdown voltage, particularly the surface breakdown voltage DSVsurf, is deteriorated, as shown in FIG. 20. However, when a difference between the distances a2 and a3 and the distances a4 to a7 is restricted to 0.4 μm or smaller, the deterioration of the withstand voltage DSVsurf can be suppressed to 5V or lower compared with the distances a4 to a7.

In the case where the charge pump circuit is stopped while boosted to the voltage Vout as shown in FIG. 13, this voltage Vout may possibly be applied to the node N2 due to the reverse flow from the output node through the MOS transistors TR4 to TR9 in the drains of the MOS transistors TR2 and TR3. For example, such case might be generated when the external power supply of the NAND-type flash memory is rapidly lowered due to an electric power failure or the like. It is therefore necessary that the product circuit design is performed such that a junction breakdown does not occur even in the above case. Particularly, in the MOS transistor TR located on the high-voltage side (later-stage side), because the threshold voltage is increased in the range of 0.5V or higher to 2V or lower by the back bias effect, a voltage drop is generated by the threshold voltage increase at the voltage node on the preceding-stage side compared to the voltage node on the later-stage side. Therefore, the problem of increasing the potential at the node N2 can effectively be prevented. Therefore, in the first embodiment, the generation of dielectric breakdown can be prevented even if the MOS transistor having a surface breakdown voltage or junction breakdown voltage lower than that of the node N9 of the later-stage MOS transistor TR9 is used as the preceding-stage MOS transistors TR2 and TR3.

As shown in FIG. 16, when the distances a2 and a3 of the MOS transistors TR2 and TR3 are decreased, the threshold voltage is increased in changing the back bias from 0V to −28V. However, because the MOS transistors TR2 and TR3 are located in the preceding stage, the effect of increasing the forward current is much larger than the increase in threshold voltage, therefore the effect of increasing the current passed through the rectifying element per unit width is obtained.

(2) MOS Transistor TR1

In the configuration according to the first embodiment, the MOS transistor TR1 has the same distance a1 as the distances a2 and a3. The gate length g1 of the MOS transistor TR1 is larger than the gate lengths g2 to g9 of the MOS transistors TR2 to TR9. The gate lengths g2 to g9 ranges from 1.5 μm to 3.5 μm. For example, the gate lengths g2 to g9 are set to 2.4 μm. On the other hand, the gate length g1 is smaller than the gate lengths g2 to g9 by the range of 0.4 μm to 1.0 μm. For example, the gate length g1 is set to 3.0 μm.

Therefore, the reverse flow of the current to the Vdd node can be prevented in the status shown in FIG. 13. This point will be described below. In the MOS transistor TR1, the maximum potential at the current terminal is lower than that of the MOS transistor TR2, and the degree of increase in threshold voltage caused by the back bias is small when the current is transferred. When the MOS transistor TR1 is formed with the same dimensions as the MOS transistors TR2 to TR9, the threshold voltage of the MOS transistor TR1 is lowered in order to satisfy requirements of the charge transfer in the MOS transistor TR9. In the status of FIG. 13, the leakage current is easily passed from the node N1 toward the Vdd node. However, in the configuration according to the first embodiment, the relationship of g1>g2 to g9 holds. Accordingly, the threshold voltage can be increased by preventing the short channel effect in the MOS transistor TR1. Additionally, the distance between the source and the drain 32 can be increased to prevent a leakage current between the source and the drain. Therefore, the voltage fluctuation can be prevented at the Vdd node and the reverse flow of the current from the node N1 toward the Vdd node can be suppressed.

(3) MOS Transistors TR4 to TR9

(3-1) Distance b

In the first embodiment, the MOS transistors TR4 to TR9 are larger than the MOS transistors TR1 to TR3 in the distances b in the gate width direction. The distances b1 to b3 are set at a constant value of 0 μm to 1.0 μm, and the distances b4 to b9 or smaller are larger than the distances b1 to b3 by the range of 0.1 μm to 0.4 μm.

As shown in FIGS. 21 and 22, the breakdown voltage is improved by increasing the distance b. At this point, as shown in FIG. 6, the width in the gate width direction of the diffusion layer 32 is smaller than that of the MOS transistor TR2, so that the distance b can be decreased without increasing the dimensions of the active region. The distance b in the gate length direction may be set at the same value as the MOS transistors TR1 to TR3 when the junction breakdown voltage does not degrade. The distances b4 to b9 in the gate length direction range from more than 0 μm and smaller than the distances b4 to b9 in the gate width direction.

Figure 7:
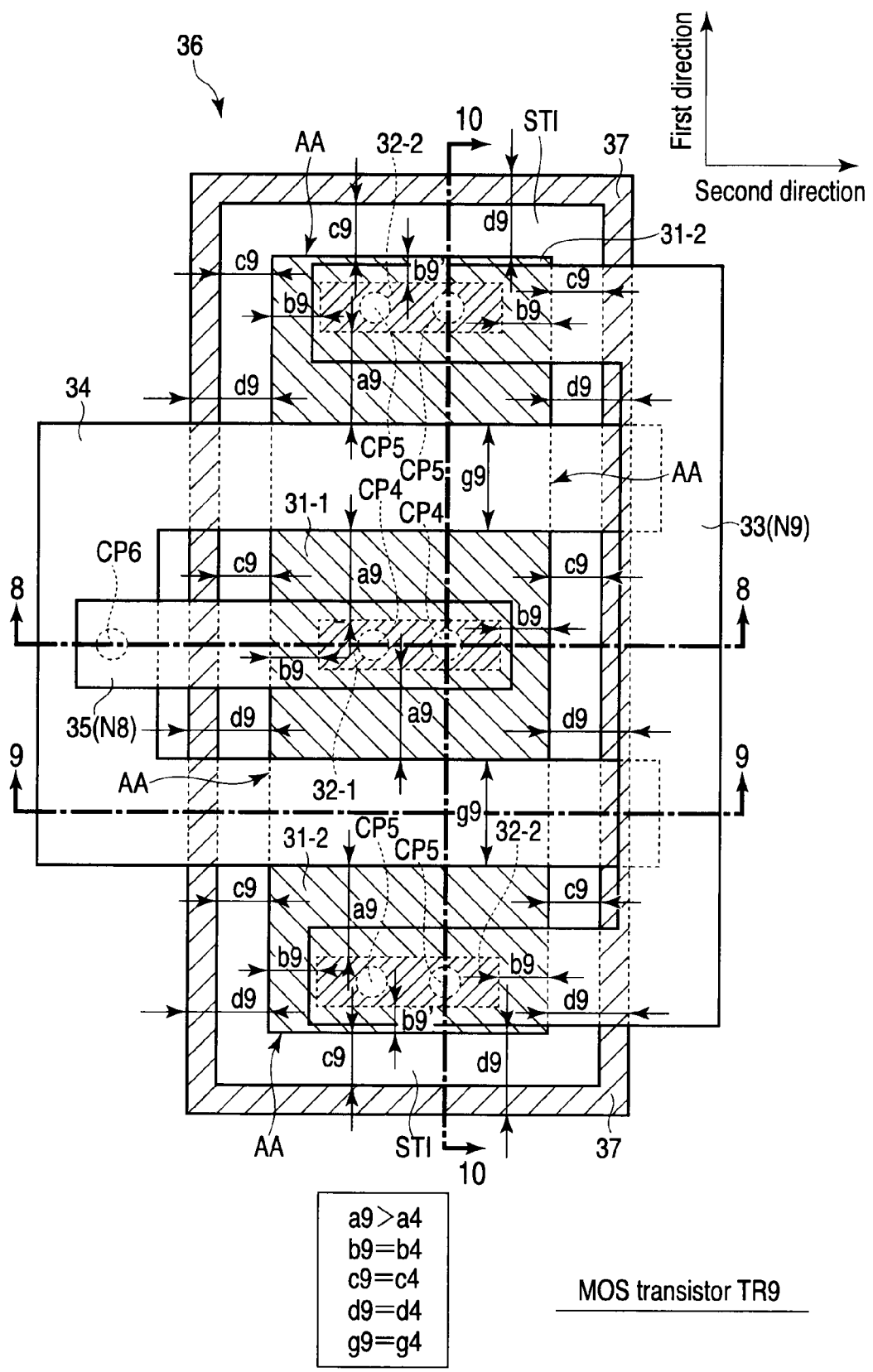
Figure 8:
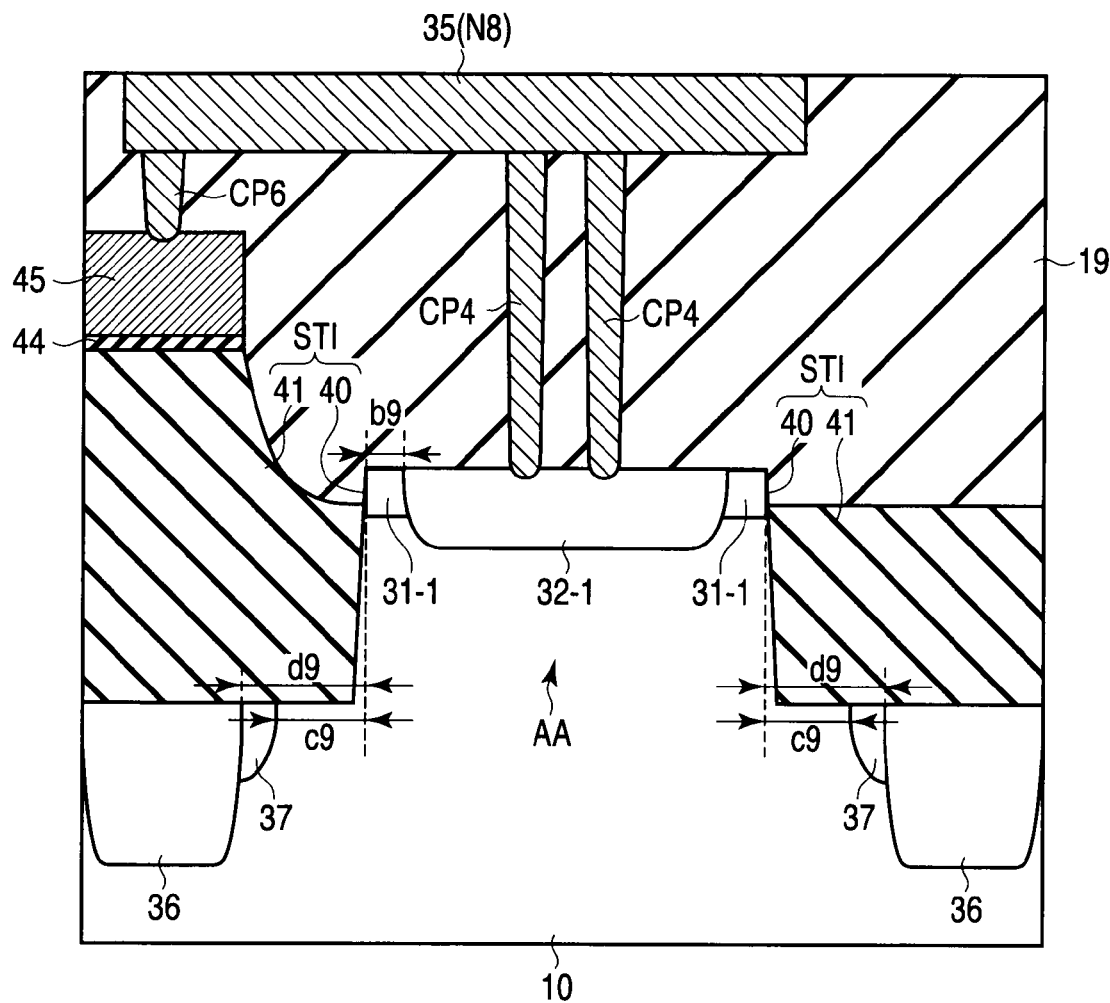
FIG. 8 is a sectional view taken along a line 8-8 of FIG. 7.

As shown in FIGS. 4, 6, and 7, the distance from the end portion of the diffusion layer 32 to the contact plugs CP4 and CP5 formed on the diffusion layer 32 is usually kept constant. Therefore, in the distance from the contact plugs CP4 and CP5 to the end portion of the element isolation region STI adjacent to the contact plugs CP4 and CP5, the MOS transistors TR1 to TR3 are smaller than the MOS transistors TR4 to TR9. That is, it can be said that the distance b is equivalently a "distance in the gate width direction from the contact plugs CP4 and CP5 to the element isolation region STI (that is, boundary between the element region AA and the element isolation region STI)".

(3-2) Distance c

In the first embodiment, the MOS transistors TR4 to TR9 are larger than the MOS transistors TR1 to TR3 in the distance c. The distances c1 to c3 are set at a constant value of 0.2 μm to 1.0 μm, and the distances c4 to c9 are larger than the distances c1 to c3 by the range of 0.1 μm to 0.6 μm.

As shown in FIG. 23, an increase in threshold voltage can be reduced by increasing the distance c when the back bias is changed from 0V to −28V. Accordingly, in the MOS transistors TR4 to TR9, a higher boosting voltage can be transferred compared with the preceding-stage MOS transistors TR1 to TR3.

As shown in FIGS. 24 and 25, when the back bias ranges from 0V to −28V, the forward current can be increased by increasing the distance c, so that a larger boosting current can be passed through compared with the MOS transistors TR1 to TR3.

This is attributed to the fact that, although the depletion layer is spread in the semiconductor substrate 10 when the back bias is applied, the increase in threshold voltage is relieved because the end of the depletion layer is fixed by the existence of the region 37. Therefore, as a larger back bias is applied, the ratio of the increase in forward current is increased due to the increase in distance c. In the first embodiment, preferably the distance c is increased in the MOS transistors TR4 to TR9 to which the large back bias is applied rather than the MOS transistors TR1 to TR3 near the boosting first stage to which the back bias is not applied too much. Therefore, the boosting performance of the charge pump circuit relative to the circuit area can be improved.

As shown in FIGS. 27 and 28, the junction breakdown voltage, particularly the surface breakdown voltage DSVsurf, can also be increased by increasing the distance c. This is attributed to the fact that the electric field of the pn-junction is further relieved by increasing the distance between the region 37 and the source and drain 32.

(3-3) Distance d

In the first embodiment, the MOS transistors TR4 to TR9 are larger than the MOS transistors TR1 to TR3 in the distance d. The distances d1 to d3 are set at a constant value of 0.6 μm to 1.6 μm, and the distances d4 to d9 are larger than the distances d1 to d3 by the range of 0.1 μm to 0.6 μm.

As shown in FIG. 28, the increase in threshold voltage can be reduced by increasing the distance d when the back bias is changed from 0V to −28V. Accordingly, in the MOS transistors TR4 to TR9, a higher boosting voltage can be transferred compared with the preceding-stage MOS transistors TR1 to TR3.

As shown in FIGS. 29 and 30, when the back bias ranges from 0V to −28V, the forward current can be increased by increasing the distance d, so that a larger boosting current can be passed through compared with the MOS transistors TR1 to TR3. The distance d of FIGS. 29 and 30 is similar to that of the distance c of FIGS. 24 and 25, thus will not be explained.

As shown in FIGS. 31 and 32, the junction breakdown voltage, particularly the surface breakdown voltage DSVsurf, can also be increased by increasing the distance d. This is attributed to the fact that the electric field of the pn-junction is further relieved by increasing the distance between the region 36 and the source and drain 32.

(4) MOS Transistors TR8 and TR9

In addition to the item (3), the MOS transistors TR8 and TR9 are larger than the MOS transistors TR1 to TR7 in the distance a. As described above, the distances a4 to a7 are set at a constant value of 0.5 μm to 1.2 μm, and the distances a8 and a9 are larger than the distances a4 to a9 by the range of 0.2 μm to 0.8 μm.

As described above, the inventor has found that the dependence of the forward current I(on) on the distance a, when an absolute value of the back bias is lower than 20V, is reversed to that, when the absolute value of the back bias is higher than 25V. As shown in FIGS. 17 and 18, when the absolute value of the back bias is lower than 20V, the forward current I(on) is lowered with respect to the increase in distance a. On the contrary, when the absolute value of the back bias is 25V or higher, the forward current I(on) is increased with respect to the increase in distance a.

The later-stage MOS transistor TR is larger than the preceding-stage MOS transistor TR in the back bias, and particularly the back bias is largely increased in the final-stage MOS transistor TR9 and the immediately preceding MOS transistor TR8. Accordingly, sometimes the absolute value of the back bias becomes 25V or more in the MOS transistors TR8 and TR9. In such cases, the forward current can be increased by increasing the distance a, which allows the driving capability to be improved in the MOS transistors TR8 and TR9. As a result as shown in FIG. 20, the surface-junction breakdown voltage DSVsurf is also increased. Accordingly, even in the case of FIG. 13, the breakdown voltages of the MOS transistors TR8 and TR9 can be maintained. This indicates that, in the case where the back bias has an absolute value of about 25V, an increase in threshold voltage is prevented to sufficiently keep a difference between the gate voltage and the threshold voltage, thereby passing a larger amount of current. Accordingly, the boosting current can be further increased by adopting this structure.

The lengths of the source and drain 31 in the gate length direction, that is, the so-called LDD length, can be increased by increasing the distance a. Therefore, in the MOS transistors TR8 and TR9, the electric field from the drain to the gate can be relieved during the high-voltage bias, and the reliability can be improved in the MOS transistors TR8 and TR9.

As shown in FIGS. 4, 6, and 7, because the distance from the end portion of the diffusion layer 32 to the contact plugs CP4 and CP5 formed on the diffusion layer 32 is usually kept constant, the MOS transistors TR8 and TR9 become largest, the MOS transistors TR3 to TR7 become the second largest, and MOS transistors TR1 to TR3 become the smallest in the distance from the contact plugs CP4 and CP5 to the gate electrode 34 adjacent to the contact plugs CP4 and CP5. That is, it can also be said that the distance a is a "distance from the contact plugs CP4 and CP5 to the gate electrode" equivalently.

(5) Conclusion

As described above, the MOS transistors TR1 to TR9 are formed in the above-described layout dimensions, thereby obtaining a higher-efficiency and excellent-reliability charge pump circuit. Because the forward current is improved in the MOS transistors TR2 to TR9, the occupied area can be reduced compared with the conventional MOS transistor. In the MOS transistors TR4 to TR9, because the increase in threshold voltage is prevented when applying the back bias, a high voltage is obtained while the number of boosting stages is decreased.

More specifically, in the preceding-stage MOS transistors TR2 and TR3, the current driving capability can be maintained by decreasing the distance a. This enables the problem (B) to be solved. At this point, although the surface breakdown voltage DSVsurf is lowered by decreasing the distance a, the difference in distance a between the MOS transistors TR2 and TR3 and the MOS transistors TR4 to TR8 can be restricted to suppress the degree of deterioration to 5V or lower. The increase in threshold voltage does not actually become a problem because the MOS transistors TR2 and TR3 are located in the preceding stage in the charge pump circuit, In the later-stage MOS transistors TR4 to TR9, the breakdown voltage can be increased by increasing the distances b, c, and d. This enables the problem (B) to be solved. The current driving capability can be increased by increasing the distances c and d, and the increase in threshold voltage can be prevented by increasing the distances c and d. This enables the problems (A) and (C) to be solved.

In the MOS transistors TR8 and TR9, the distance a is increased. As a result, the current driving capability can be increased, and the breakdown voltage can also be increased. This also enables the problems (A) and (C) to be solved.

Obviously, it is not necessary for all the dimensions of the distances a to d and gate length g to be set as described above. Even if some dimensions are designed based on the above-described condition, the characteristic of the charge pump circuit can be effectively improved compared with the conventional technique.

Second Embodiment

A semiconductor device according to a second embodiment of the invention will be described. In the second embodiment, a three-phase clock is used in the configuration according to the first embodiment. Only the points different from the first embodiment will be described below.

Figure 33:
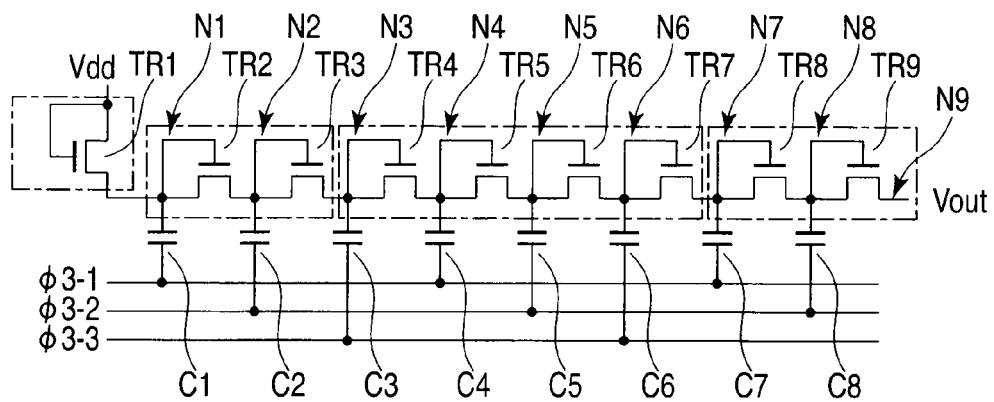
FIG. 33 is a circuit diagram showing a charge pump circuit according to a second embodiment of the invention.

FIG. 33 is a circuit diagram showing a charge pump circuit 6 of the second embodiment. In FIG. 33, respective broken lines indicate that the MOS transistors TR located therein have the same dimensions, respectively. As shown in FIG. 33, the charge pump circuit 6 of the second embodiment differs from the charge pump circuit 6 according to the first embodiment in the following points. A clock $\phi$3-1 is input into the other electrode of the capacitor element Cj connected to the node Nj (j=1, 4, and 7). A clock $\phi$3-2 is input into the other electrode of the capacitor element C(j+1) connected to the node N(j+1). A clock $\phi$3-3 is input into the other electrode of the capacitor element C(j+2) connected to the node N(j+2). The clocks $\phi$3-1 to $\phi$3-3 have waveforms whose phases are shifted from one another. For example, the phases are shifted by 120 degrees. In the clocks $\phi$3-1 to $\phi$3-3, an inclination (slew rate) at an up edge is smaller than an inclination at a down edge. That is, the rising speed of the clock is slower than the falling speed. Other configurations are similar to those according to the first embodiment.

The first embodiment can be applied to the charge pump circuit 6 of the second embodiment in which a three-phase clock is used, and an effect similar to that according to the first embodiment is obtained. The use of the three-phase clock shown in FIG. 34 can efficiently transfer the charges even if the MOS transistor having a large reverse current is used as the rectifying element. As shown in FIG. 34, because the clock $\phi$3-1 rises to Vcc at the timing the clock $\phi$3-2 rises from GND to Vcc, a current is hardly passed in the reverse direction of the junction. Because the clock $\phi$3-3 rapidly falls down to GND at the same timing, the current is selectively and easily passed from the capacitor element C2 toward the capacitor element C3. The reverse recovery time can be held in a ramp portion where the slew rate on the voltage rising side is slow. Accordingly, the charge pump circuit in which the reverse current flowing from the boosting potential side toward the low potential side is small can be realized.

Third Embodiment

A semiconductor device according to a third embodiment of the invention will be described. In the third embodiment, a four-phase clock is used in the configuration according to the first embodiment. Only the points different from the first embodiment will be described below.

FIG. 35 is a circuit diagram showing a charge pump circuit 6 of the third embodiment. In FIG. 35, respective broken lines indicate that the MOS transistors TR located therein have the same dimensions, respectively. As shown in FIG. 35, the charge pump circuit 6 of the third embodiment differs from the charge pump circuit 6 according to the first embodiment in the following points. A clock $\phi$4-1 is input into the other electrode of the capacitor element Cj connected to the node Nj (j=1 and 5). A clock $\phi$4-2 is input into the other electrode of the capacitor element C(j+1) connected to the node N(j+1). A clock $\phi$4-3 is input into the other electrode of the capacitor element C(j+2) connected to the node N(j+2). A clock $\phi$4-4 is input into the other electrode of the capacitor element C(j+3) connected to the node N(j+3). The clocks $\phi$4-1 to $\phi$4-4 have waveforms whose phases are shifted from one another. For example, the phases are shifted by 90 degrees. Unlike the second embodiment, in the clocks $\phi$4-1 to $\phi$4-4, the inclination at the up edge may be equal to the inclination at the down edge. Other configurations are similar to those according to the first embodiment.

Figure 36:
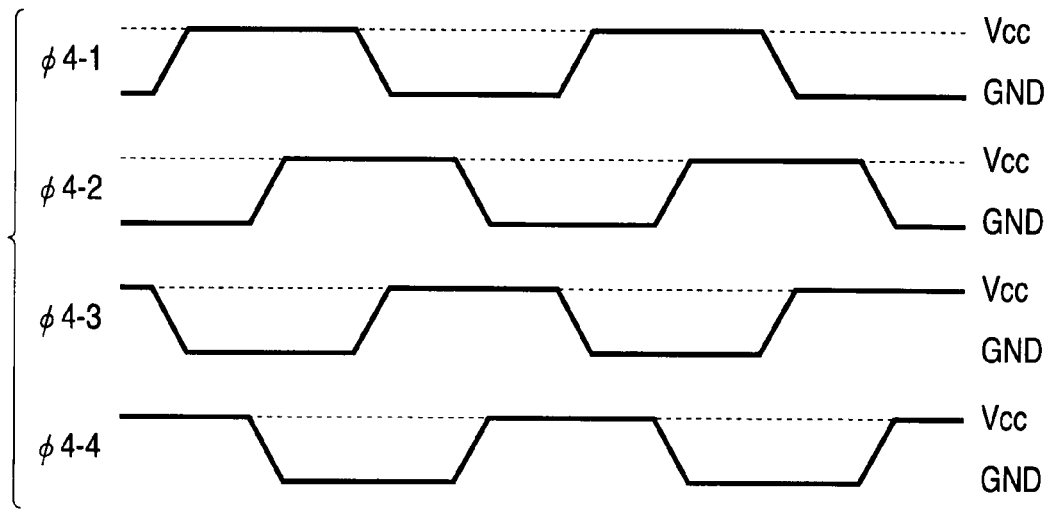
FIG. 36 is a timing chart showing a voltage at each node of the charge pump circuit according to the third embodiment.

The first embodiment can be applied to the charge pump circuit 6 of the third embodiment in which the four-phase clock is used, and the effect similar to that according to the first embodiment is obtained. Similarly to the second embodiment, the use of the four-phase clock shown in FIG. 36 can efficiently transfer the charges. As shown in FIG. 36, because the clock $\phi$4-1 rises to Vcc at the timing the clock $\phi$4-2 rises from GND to Vcc, a current is hardly passed in the reverse direction of the junction. Because the clock $\phi$4-3 becomes GND at the same timing, the current is selectively and easily passed from the capacitor element C2 toward the capacitor element C3. Similarly to the second embodiment, the reverse recovery time can be secured in the ramp portion of the clock rising. Accordingly, a charge pump circuit in which the reverse current flow from the boosting potential side toward the low potential side is small can be realized.

Thus, the semiconductor devices of the first to third embodiments can realize a charge pump circuit in which the boosting efficiency can be enhanced while enlargement of the circuit area is prevented. That is, in the series-connected rectifying elements TR of the charge pump circuit 6, the dimensions (distances a to d and width g) are systematically and orderly changed from the preceding state toward the later stage in the series connection.

For example, assuming that x is the distance between the source or drain 32 of the rectifying element TR and the gate electrode close to the source or drain 32, the distance x is increased in the high-voltage application portion of the charge pump circuit 6. Therefore, the back bias effect can be reduced in the rectifying element TR to sufficiently secure the current per unit width (gate width). On the other hand, the distance x is decreased in the low-voltage application portion. Therefore, the current per unit width can be sufficiently secured in the low-voltage application portion. Accordingly, a higher-efficiency charge pump circuit 5 can be realized while the circuit area is reduced.

In the embodiments, the MOS transistors TR2 and TR3 have the same dimensions, the MOS transistors TR4 to TR8 have the same dimensions, and the MOS transistors TR8 and TR9 have the same dimensions. The embodiments are not limited to the above dimensions, and the dimensions of the MOS transistors TR can appropriately be selected so as to satisfy the necessary breakdown voltage or current driving force. That is, it is only necessary to increase the distances a to d as the MOS transistor TR (that is, the MOS transistor on the later-stage side) has the larger absolute value of the applied voltage. The same holds true for not only the charge pump circuit, which generates a positive voltage, but the charge pump circuit which generates a negative voltage. That is, although a charge pump circuit which generates a positive voltage is described in the embodiments, the embodiments can also be applied to a charge pump circuit which generates a negative voltage.

Figure 37:
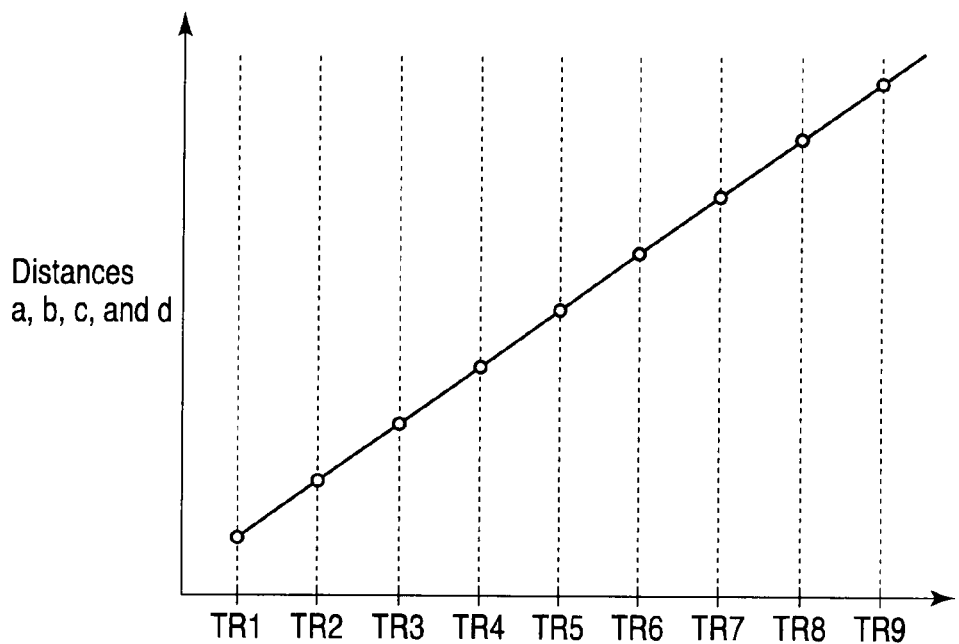
FIG. 37 is a graph showing distances a to d in MOS transistors TR1 to TR9 according to the first to third embodiments.

Accordingly, the distances a to d are not limited to the case shown in FIG. 11. For example, as shown in FIG. 37, all the distances a to d may be changed for all the MOS transistors TR. Obviously, the distances a to d are not limited to the case shown in FIG. 37. Each of the dimensions may independently be set as long as the magnitude relation is maintained for the distances a to d and the width g in the connection order of the MOS transistors TR.

Figure 38:
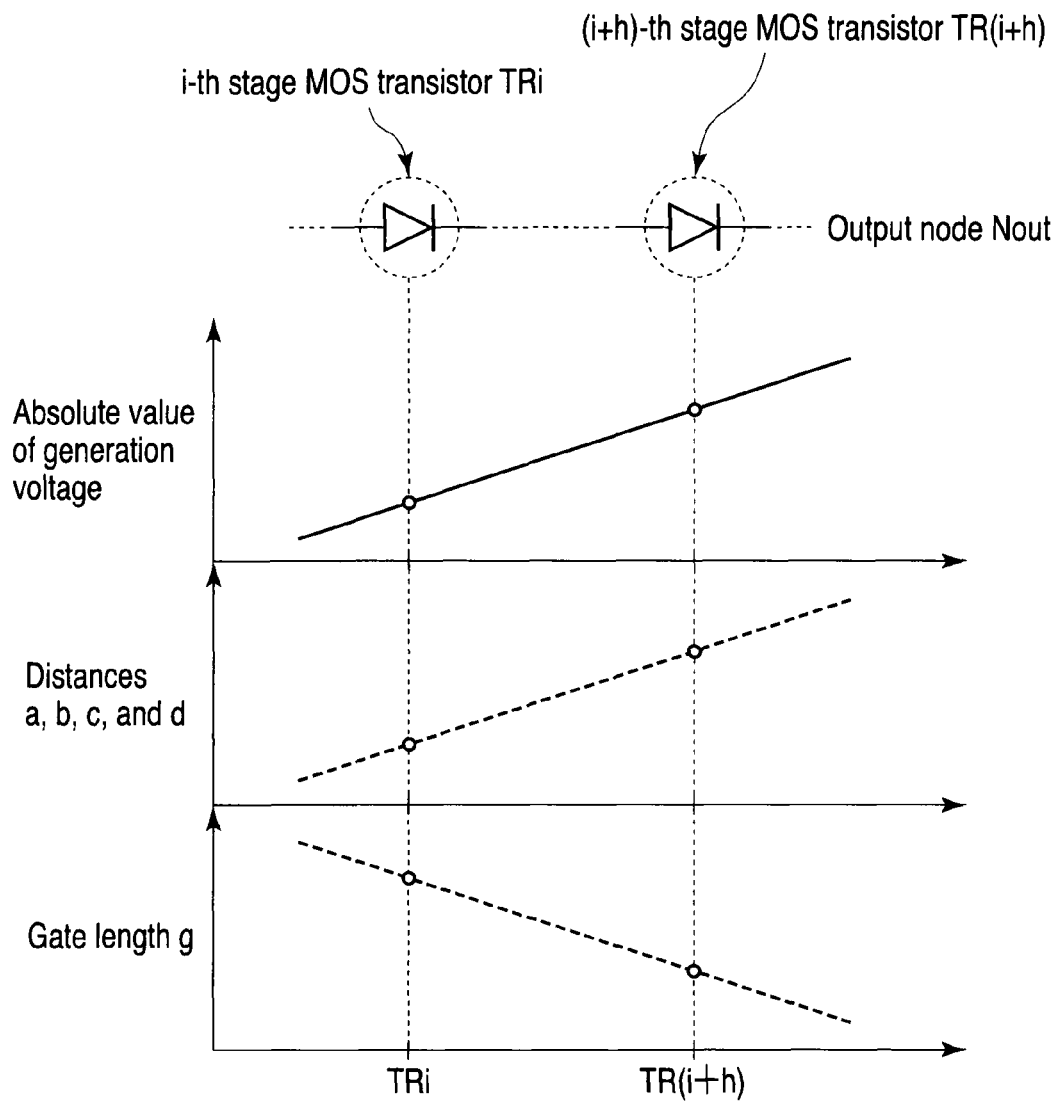
FIG. 38 is a graph showing a generation voltage, distances a to d, and a gate length g in MOS transistors TRi and TR(i+h) according to the first to third embodiments.

This point will be described with reference to FIG. 38. FIG. 38 is a graph showing a relationship between the position of the rectifying element (MOS transistor TR) in the charge pump circuit 6 and the absolute value of the generation voltage, distances a to d, and gate length g according to the position of each MOS transistor TR. In FIG. 38, the rectifying element is expressed as a diode.

As shown in FIG. 38, the MOS transistors TRi to TR(i+h) are series-connected (h is a natural number), and the MOS transistor TR(i+h) is located closer to the output node Nout side than the MOS transistor TRi. The MOS transistor TR may be disposed in the preceding stage of the MOS transistor TRi, the MOS transistor TR may be disposed in the later stage of the MOS transistor TR(i+h), or the MOS transistor TR may be disposed between the MOS transistor TRi and the MOS transistor TR(i+h). The generation voltage of the MOS transistor TR(i+h) is larger than the generation voltage of the preceding-stage MOS transistor TRi.

In the series-connected structure, the distances a to d of at least one of the MOS transistor TR(i+h) are larger than the distances a to d of the MOS transistor Tri, respectively. The gate length g of at least one of the MOS transistor TRi is larger than the gate length g of MOS transistor TR(i+h).

In the case where the MOS transistor TR is disposed between the MOS transistor TRi and the MOS transistor TR(i+h), the distances a to d of the MOS transistor TR are equal to or larger than the distances a to d of the MOS transistor TRi, and the distances a to d of the MOS transistor TR are equal to or smaller than the distances a to d of the MOS transistor TR(i+h). The gate length g of the MOS transistor TR is equal to or smaller than the gate length g of the MOS transistor TRi, and the gate length g of the MOS transistor TR is equal to or larger than the gate length g of the MOS transistor TR(i+h). For example, the MOS transistor TR(i+h) is located in the final stage in the series connection and the MOS transistor TRi is located in the initial stage in the series connection.

In the embodiments, a p-type semiconductor substrate with surface acceptor concentration of $10^{14}$ cm$^{-3}$ or higher to $5\times10^{16}$ cm$^{-3}$ or lower is used as the semiconductor substrate 10. In order to adjust the threshold voltage of the MOS transistor TR, boron or indium may be ion-implanted in a depth range up to 0.5 μm from the surface such that the acceptor concentration has a peak of $10^{14}$ cm$^{-3}$ or higher to $5\times10^{16}$ cm$^{-3}$ or lower.

The embodiments are not limited to the above. For example, in the method for the insulating film of the element isolation region, a method other than that for transforming silicon into the silicon oxide film or silicon nitride film may be adopted. For example, a method for injecting oxygen ions into the deposited silicon or a method for oxidizing the deposited silicon may be adopted. The inter-gate insulation film 15 and the block insulation film 44 may be formed of $TiO_2$, HfO, $Al_2O_3$, HfAlO, HfSiO, tantalum oxide, strontium titanate or barium titanate, lead zirconate titanate, silicon oxynitride, silicon oxide, silicon nitride, or a stacked structure thereof.

In the embodiments, the p-type silicon substrate is used as the semiconductor substrate 10. Alternatively, another silicon-contained single-crystal semiconductor substrate such as a SiGe mixed crystal and a SiGeC mixed crystal may be used instead of the p-type silicon substrate. An SiGe mixed crystal, SiGeC mixed crystal, silicide or polyside such as TiSi, NiSi, CoSi, TaSi, WSi, and MoSi, and a metal such as Ti, Al, Cu, TiN, and W may be used as the conductive layers 16 and 45 functioning as a part of the gate electrode. The conductive layers 16 and 45 may be formed by a polycrystal above material or a stacked structure thereof. Amorphous silicon, amorphous SiGe, and amorphous SiGeC or stacked structure thereof may be used as the conductive layers 14, 16, 43, and 45.

In the embodiment, the NAND type flash memory is described by way of example. Additionally, the embodiments can be applied to a 3Tr-NAND type flash memory in which the number of memory cell transistors of the NAND cell is decreased to one in the NAND type flash memory, and a NOR type flash memory. The embodiments may also be applied to a 2Tr type flash memory in which the selection transistor ST1 on the drain side is removed from the 3Tr-NAND type flash memory, and the embodiments may widely be applied to nonvolatile semiconductor memories having stacked gate structures.

A NAND type memory cell in which the polycrystalline silicon film 14 is used as the floating gate is described in detail in the embodiments. Obviously, the embodiments can clearly be applied to a NAND type memory having a so-called MONOS structure in which an insulating film is used as the charge accumulation layer. In MONOS structure, the charge accumulation layer formed of the silicon nitride film, the silicon oxynitride film, the HfSiO film, the HfAlO film, the AlOx film, the HfO film, the TiO film, the TaO film, or the stacked structure thereof. In the case where the metal silicide layer is applied to the control gate electrode 16, the metal silicide layer may be formed so as to contact the insulation film 15.

Additional advantages and modifications will readily occur to those skilled in the art. Therefore, the invention in its broader aspects is not limited to the specific details and representative embodiments shown and described herein.

Accordingly, various modifications may be made without departing from the spirit or scope of the general inventive concept as defined by the appended claims and their equivalents.

What is claimed is:

1. A semiconductor device comprising:
   element regions each of which is surrounded by an element isolation region, the element regions having transistor regions and capacitor regions;
   MOS transistors each of which is formed on one of the transistor regions, each of the MOS transistors having a source, a drain, and a gate;
   capacitor elements each of which is formed on one of the capacitor regions;
   a voltage generating circuit in which current paths of the MOS transistors are series-connected and each of the capacitor elements is connected to one of the MOS transistors via either of the source and the drain thereof, the voltage generating circuit outputting a voltage from a first MOS transistor in a final stage of the series connection, the voltage generating circuit inputting a voltage from a second MOS transistor in a previous stage in the series connection;
   a first impurity-doped region which is formed on at least either of the source and the drain;
   a contact plug which is formed on the first impurity-doped region to connect the MOS transistors or one of the MOS transistors and one of the capacitor elements, a distance between the gate and the first impurity-doped region for the first MOS transistor being larger than that for the second MOS transistor; and
   a memory cell which is capable of holding data, the voltage output by the voltage generating circuit being applied to the memory cell.

2. The device according to claim 1, wherein each of the capacitor elements includes:
   a n-type well region which is formed in a surface region of the one of the capacitor regions and acts as one of electrodes;
   an insulation film which is formed on the well region; and
   a gate which is formed on the insulation film and acts as the other electrode.

3. The device according to claim 1, wherein the one of the transistor regions contains a p-type impurity which is doped with a concentration of $10^{14}$ cm$^{-3}$ to $5 \times 10^{16}$ cm$^{-3}$ in a region from a surface to a depth of 1 μm.

4. The device according to claim 1, further comprising a second impurity-doped region which is provided immediately below the element isolation region and has a peak concentration of a p-type impurity of $10^{16}$ cm$^{-3}$ to $10^{18}$ cm$^{-3}$,
   wherein an interval between one of the element regions and the second impurity-doped region ranges from 0.2 μm to 1.6 μm.

5. The device according to claim 1, wherein a first clock signal is input to one end of the current path of one of the MOS transistors in an even-numbered stage through one of the capacitor elements, and
   a second clock signal is input to one end of the current path of one of the MOS transistors in an odd-numbered stage through one of the capacitor elements, the second clock signal differing from the first clock signal in phase.

6. The device according to claim 1, wherein each of the MOS transistors includes:
   a first gate electrode layer which is formed on the first one of the element regions with a first gate insulation film interposed therebetween; and
   a second gate electrode layer which is formed on the first gate electrode layer with a first inter-gate insulation film interposed therebetween, the second gate electrode layer being electrically connected to the first gate electrode layer, and
   the memory cell includes:
   a charge accumulation layer which is formed on a semiconductor substrate with a second gate insulation film interposed therebetween; and
   a control gate electrode which is formed on the charge accumulation layer with a second inter-gate insulation film interposed therebetween, the control gate electrode being electrically isolated to the charge accumulation layer.

7. The device according to claim 1, wherein an impurity concentration of the first impurity-doped region is higher than that of the source and the drain.

8. The device according to claim 1, wherein the first impurity-doped region is formed deeper than the source and the drain.

9. The device according to claim 1, wherein the distance between the gate and the first impurity-doped region in a latter stage of the series-connection of the MOS transistors is equal to or greater than that in a former stage of the MOS transistor.

10. A semiconductor device comprising:
    element regions each of which is surrounded by an element isolation region, the element regions having transistor regions and capacitor regions;
    MOS transistors each of which is formed on one of the transistor regions, each of the MOS transistors having a source, a drain, and a gate;
    capacitor elements each of which is formed on one of the capacitor regions;
    a voltage generating circuit in which current paths of the MOS transistors are series-connected and each of the capacitor elements is connected to one of the MOS transistors via either of the source and the drain thereof, the voltage generating circuit outputting a voltage from a first MOS transistor in a final stage of the series connection, the voltage generating circuit inputting a voltage from a second MOS transistor in a previous stage in the series connection;
    a first impurity-doped region which is formed on at least either of the source and the drain;
    a contact plug which is formed on the first impurity-doped region to connect the MOS transistors or one of the MOS transistors and one of the capacitor elements, a distance between the gate and the first impurity-doped region for the first MOS transistor being larger than that for the second MOS transistor, a distance in a gate width direction of the gate between the contact plug for the first MOS transistor and the element isolation region being larger than that between the contact plug for the second MOS transistor and the element isolation region; and
    a memory cell which is capable of holding data, the voltage output by the voltage generating circuit being applied to the memory cell.

11. The device according to claim 10, wherein each of the capacitor elements includes:
    a n-type well region which is formed in a surface region of the one of the capacitor regions and acts as one of electrodes;
    an insulation film which is formed on the well region; and
    a gate which is formed on the insulation film and acts as the other electrode.

12. The device according to claim 10, wherein the one of the transistor regions contains a p-type impurity which is doped with a concentration of $10^{14}$ cm$^{-3}$ to $5\times10^{16}$ cm$^{-3}$ in a region from a surface to a depth of 1 μm.

13. The device according to claim 10, further comprising a second impurity-doped region which is provided immediately below the element isolation region and has a peak concentration of a p-type impurity of $10^{16}$ cm$^{-3}$ to $10^{18}$ cm$^{-3}$,
wherein an interval between one of the element regions and the second impurity-doped region ranges from 0.2 μm to 1.6 μm.

14. The device according to claim 10, wherein a first clock signal is input to one end of the current path of one of the MOS transistors in an even-numbered stage through one of the capacitor elements, and
a second clock signal is input to one end of the current path of one of the MOS transistors in an odd-numbered stage through one of the capacitor elements, the second clock signal differing from the first clock signal in phase.

15. The device according to claim 10, wherein each of the MOS transistors includes:
a first gate electrode layer which is formed on the one of the transistor regions with a first gate insulation film interposed therebetween; and
a second gate electrode layer which is formed on the first gate electrode layer with a first inter-gate insulation film interposed therebetween, the second gate electrode layer being electrically connected to the first gate electrode layer, and
the memory cell includes:
a charge accumulation layer which is formed on a semiconductor substrate with a second gate insulation film interposed therebetween; and
a control gate electrode which is formed on the charge accumulation layer with a second inter-gate insulation film interposed therebetween, the control gate electrode being electrically isolated to the charge accumulation layer.

16. The device according to claim 10, wherein an impurity concentration of the first impurity-doped region is higher than that of the source and the drain.

17. The device according to claim 10, wherein the first impurity-doped region is formed deeper than the source and the drain.

18. The device according to claim 10, wherein the distance between the gate and the first impurity-doped region in a latter stage of the series-connection of the MOS transistors is equal to or greater than that in a former stage of the series-connection of the MOS transistors,
the distance in a gate width direction between the contact plug and the element isolation region in a latter stage of the series-connection of the MOS transistors is equal to or greater than that in a former stage of the series-connection of the MOS transistors.

19. A semiconductor device comprising:
element regions each of which is surrounded by an element isolation region, the element regions having transistor regions and capacitor regions;
MOS transistors each of which is formed on one of the transistor regions, each of the MOS transistors having a source, a drain, and a gate;
capacitor elements each of which is formed on one of the capacitor regions;
a voltage generating circuit in which current paths of the MOS transistors are series-connected and each of the capacitor elements is connected to one of the MOS transistors via either of the source and the drain thereof, the voltage generating circuit outputting a voltage from a first MOS transistor in a final stage of the series connection, the voltage generating circuit inputting a voltage from a second MOS transistor in a previous stage in the series connection;
a first impurity-doped region which is formed on at least either of the source and the drain;
a second impurity-doped region which is formed immediately below the element isolation region and surrounds the element regions; and
a contact plug which is formed on the first impurity-doped region to connect the MOS transistors or one of the MOS transistors and one of the capacitor elements, a distance between the gate and the first impurity-doped region for the first MOS transistor being larger than that for the second MOS transistor, a distance between one of the transistor regions for the first MOS transistor and the second impurity-doped region being larger than that between one of the transistor regions for the second MOS transistor and the second impurity-doped region; and
a memory cell which is capable of holding data, the voltage output by the voltage generating circuit being applied to the memory cell.

20. The device according to claim 19, wherein each of the capacitor elements includes:
a n-type well region which is formed in a surface region of the one of the capacitor regions and acts as one of electrodes;
an insulation film which is formed on the well region; and
a gate which is formed on the insulation film and acts as the other electrode.

21. The device according to claim 19, wherein the one of the transistor regions contains a p-type impurity which is doped with a concentration of $10^{14}$ cm$^{-3}$ to $5\times10^{16}$ cm$^{-3}$ in a region from a surface to a depth of 1 μm.

22. The device according to claim 19, wherein the second impurity-doped region contains p-type impurity,
the p-type impurity has a peak concentration of $10^{16}$ cm$^{-3}$ to $10^{18}$ cm$^{-3}$, and
an interval between one of the element regions and the second impurity-doped region ranges from 0.2 μm to 1.6 μm.

23. The device according to claim 19, wherein a first clock signal is input to one end of the current path of one of the MOS transistors in an even-numbered stage through one of the capacitor elements, and
a second clock signal is input to one end of the current path of one of the MOS transistors in an odd-numbered stage through one of the capacitor elements, the second clock signal differing from the first clock signal in phase.

24. The device according to claim 19, wherein an impurity concentration of the first impurity-doped region is higher than that of the source and the drain.

25. The device according to claim 19, wherein the first impurity-doped region is formed deeper than the source and the drain.

26. The device according to claim 19, wherein the distance between the gate and the first impurity-doped region in a latter stage of the series-connection of the MOS transistors is equal to or greater than that in a former stage of the series-connection of the MOS transistors,
the distance between the one of the transistor regions and the second impurity-doped region in a latter stage of the series-connection of the MOS transistors is equal to or greater than that in a former stage of the series-connection of the MOS transistors.

* * * * *